United States Patent [19]
Kijima

[11] Patent Number: 6,010,796
[45] Date of Patent: Jan. 4, 2000

[54] ELECTROLUMINESCENT DEVICE

[75] Inventor: Yasunori Kijima, Tokyo, Japan

[73] Assignee: Sony Corporation, Tokyo, Japan

[21] Appl. No.: 08/889,179

[22] Filed: Jul. 7, 1997

[30] Foreign Application Priority Data

Jul. 9, 1996 [JP] Japan .................................. 8-199789
May 16, 1997 [JP] Japan .................................. 9-126961

[51] Int. Cl.$^7$ .................................................. H05B 33/14
[52] U.S. Cl. ........................ 428/690; 428/691; 428/917; 313/504; 313/506
[58] Field of Search .................................. 428/690, 917; 313/504, 506; 546/88, 49

[56] References Cited

U.S. PATENT DOCUMENTS 5,393,614  2/1995  Nakada .................................. 428/690
5,837,391  11/1998  Utsugi .................................... 428/690
5,861,219  1/1999  Thompson et al. ...................... 428/690

FOREIGN PATENT DOCUMENTS

WO 94/03031  2/1994  WIPO .
WO 95/31515  11/1995  WIPO .

OTHER PUBLICATIONS

Database WPI Section Ch, Week 9427 Derwent Publications Ltd., London, GB; Class L03, AN 94-222286 XP002064432 & JP 06 158 038 A (Pioneer Electronic Corp), Jun. 7, 1994.

W. Kowalsky et al: "Organic Light Emitting Diodes" IPRM 1996 Eighth International Conference on Indium Phosphide and Related Materials (Cat. No. 96CH35930), Proceedings of 8th International Conference on Indium Phosphide and Related Materials, Schwabisch–Gmund, Germany, Apr. 21–25, 1996, ISBN 0–7803–3283–0, 1996, New York, NY, USA, IEEE, USA, pp. 450–453, XP002064431.

P.L. Burn et al, Nature, vol. 356, pp. 47–49, Mar. 5, 1992.

C.H. Chen et al, Macromol. Symp. vol. 125, pp. 1–48, Apr. 1997.

M. Hamaguchi et al , Chem. Abstr. 125: 88413, Aug. 1996.

J. Kalinowski in "Organic Electroluminescent Materials and Devices" by S. Miyata and H.S. Nalwa, Gordon and Breach Publishers, The Netherlands, pp. 1–72, Jun. 1997.

*Primary Examiner*—Charles Nold
*Attorney, Agent, or Firm*—Hill & Simpson

[57] ABSTRACT

An organic electroluminescent device of a single heterostructure is fabricated by forming a transparent electrode (anode) of ITO, a hole transport layer, an electron transport layer and a metal electrode (cathode) in that order on a glass substrate. An exciton generation promoting layer is formed between the hole transport layer and the electron transport layer. The hole transport layer is a two-layer structure consisting of a hole transport light emitting layer or a hole injection layer, and a hole transport light emitting layer. Exciton generation in the hole transport light emitting layers $4a$ and $4b$ can be promoted. The hole injection layer enables efficient hole injection.

4 Claims, 25 Drawing Sheets

$R^1$ TO $R^8$ ARE HYDROGEN ATOMS, SUBSTITUTIONAL OR NONSUBSTITUTIONAL ALKYL GROUPS, SUBSTITUTIONAL OR NONSUBSTITUTIONAL ARYL GROUPS, SUBSTITUTIONAL OR NONSUBSTITUTIONAL AMINO GROUPS, HALOGEN ATOMS, NITRO GROUPS, CYANO GROUPS OR HYDROXYL GROUPS.

F I G. 3
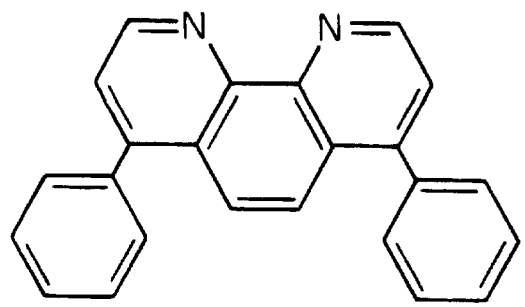
F I G. 4
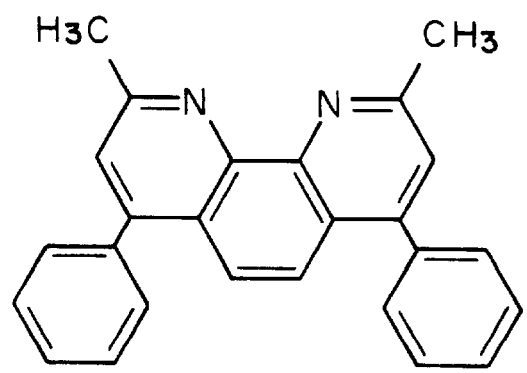
F I G. 5
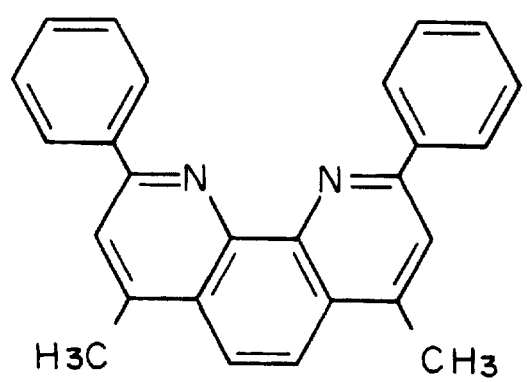

F I G. 9
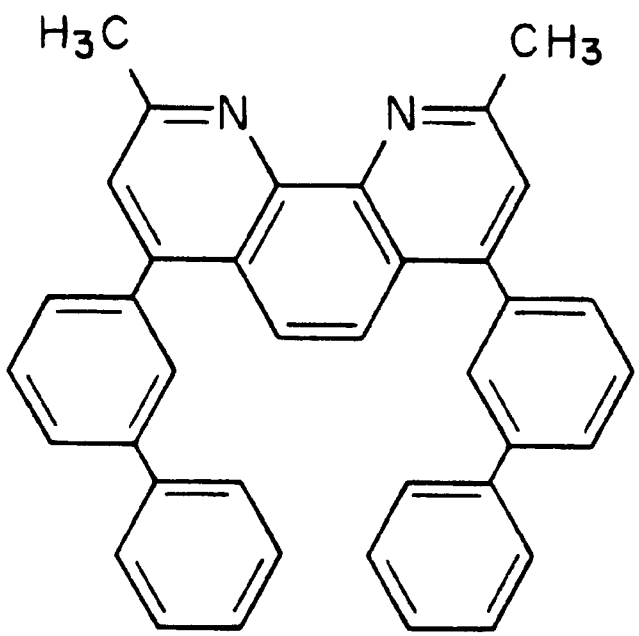
F I G. 10
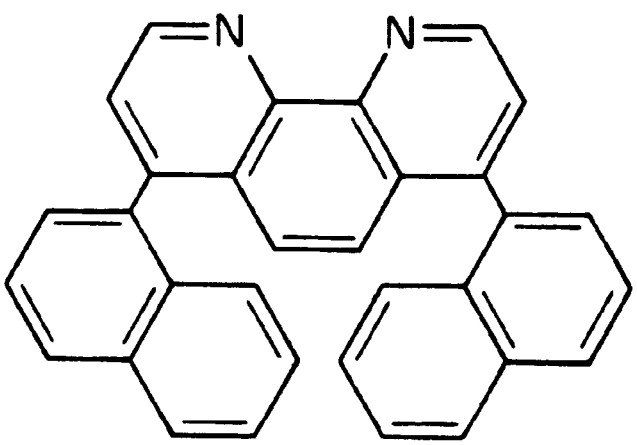

F I G. 18A
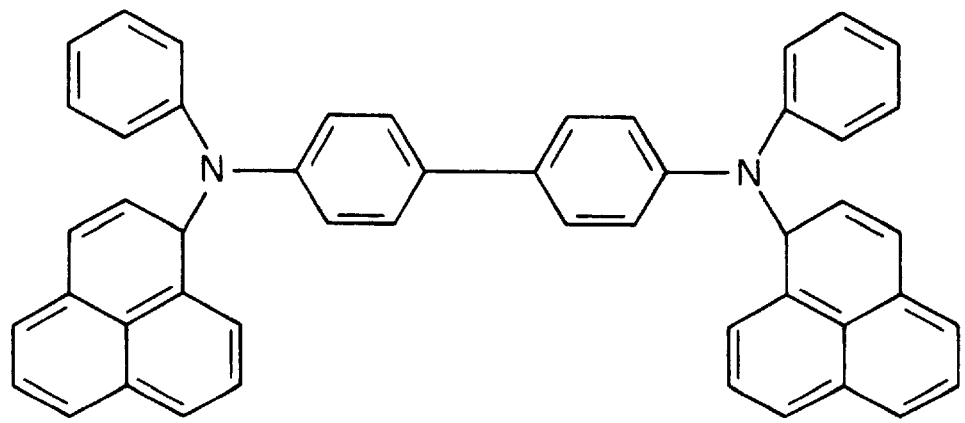
F I G. 18B
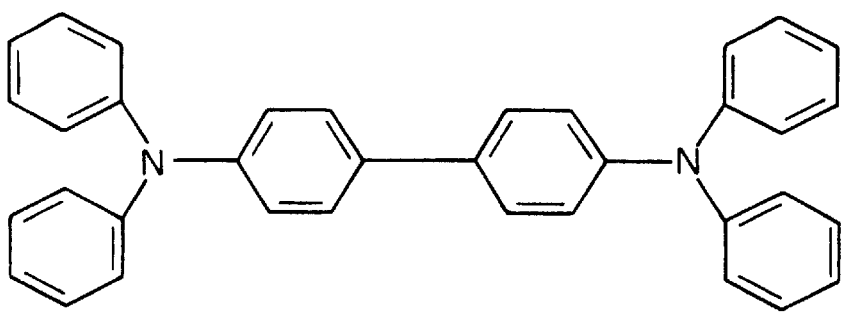
F I G. 18C
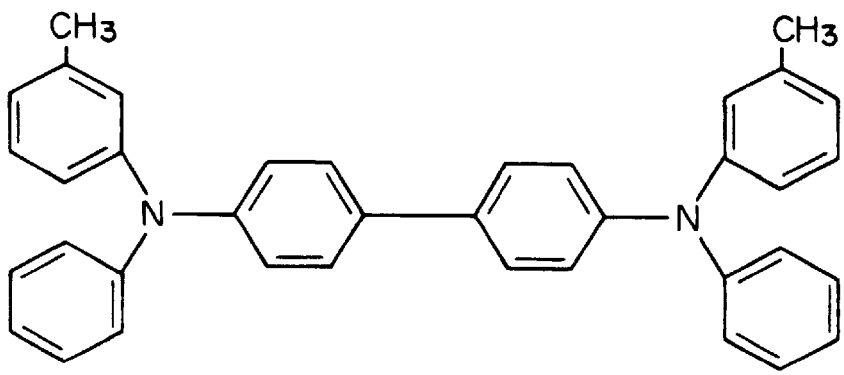

F I G. 22
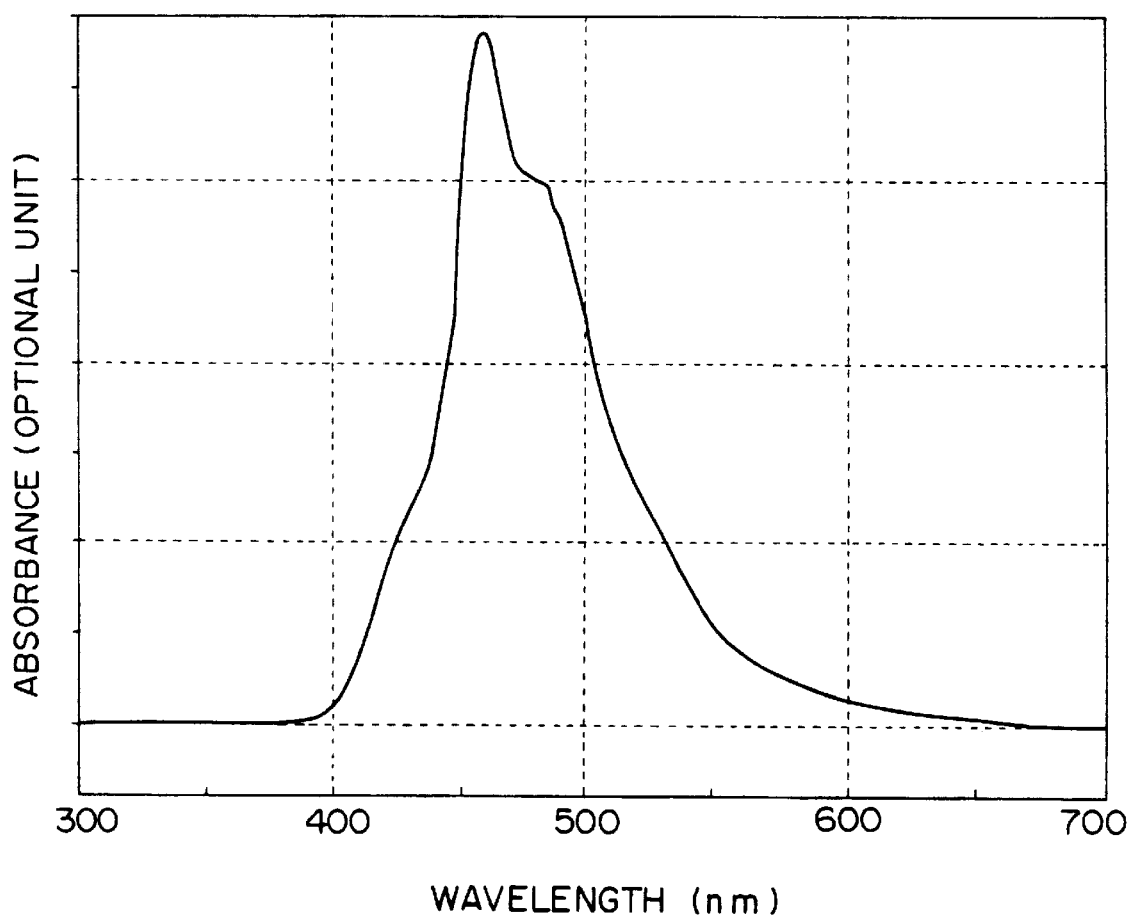

F I G. 24
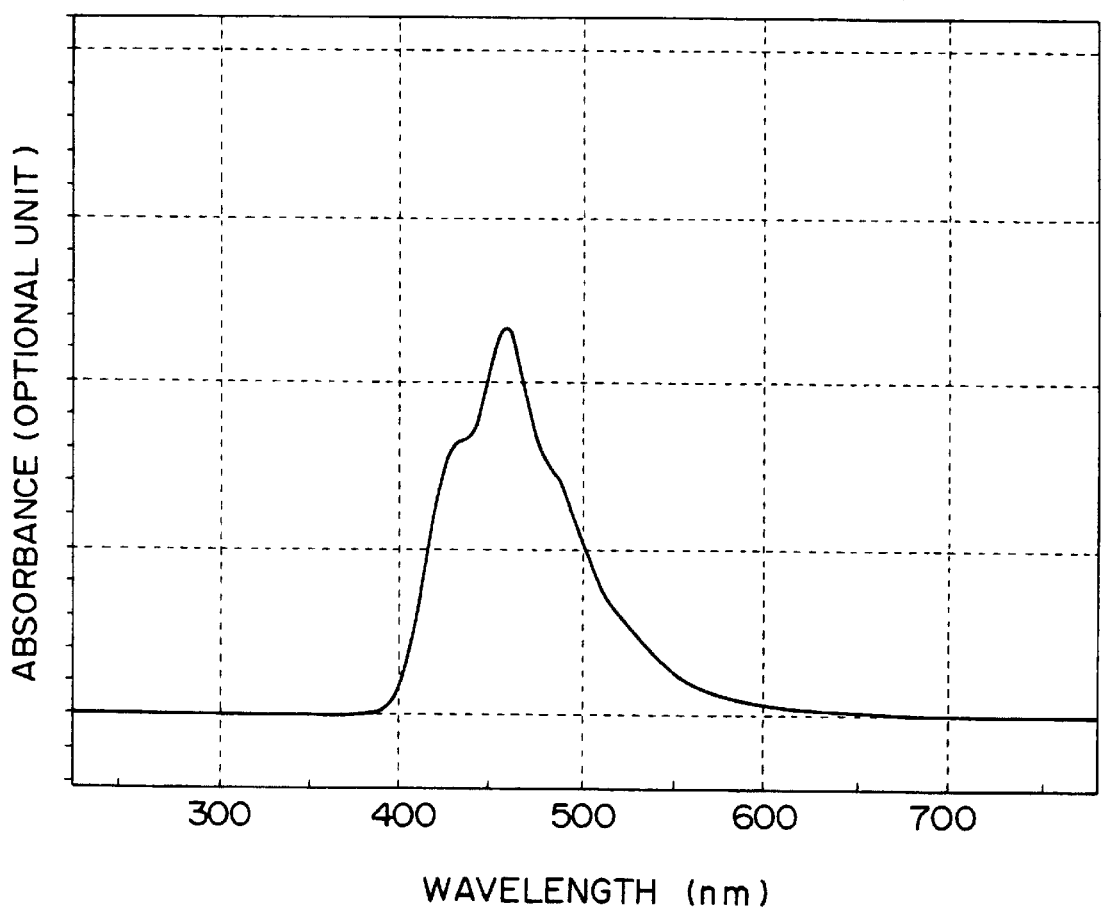

F I G. 26
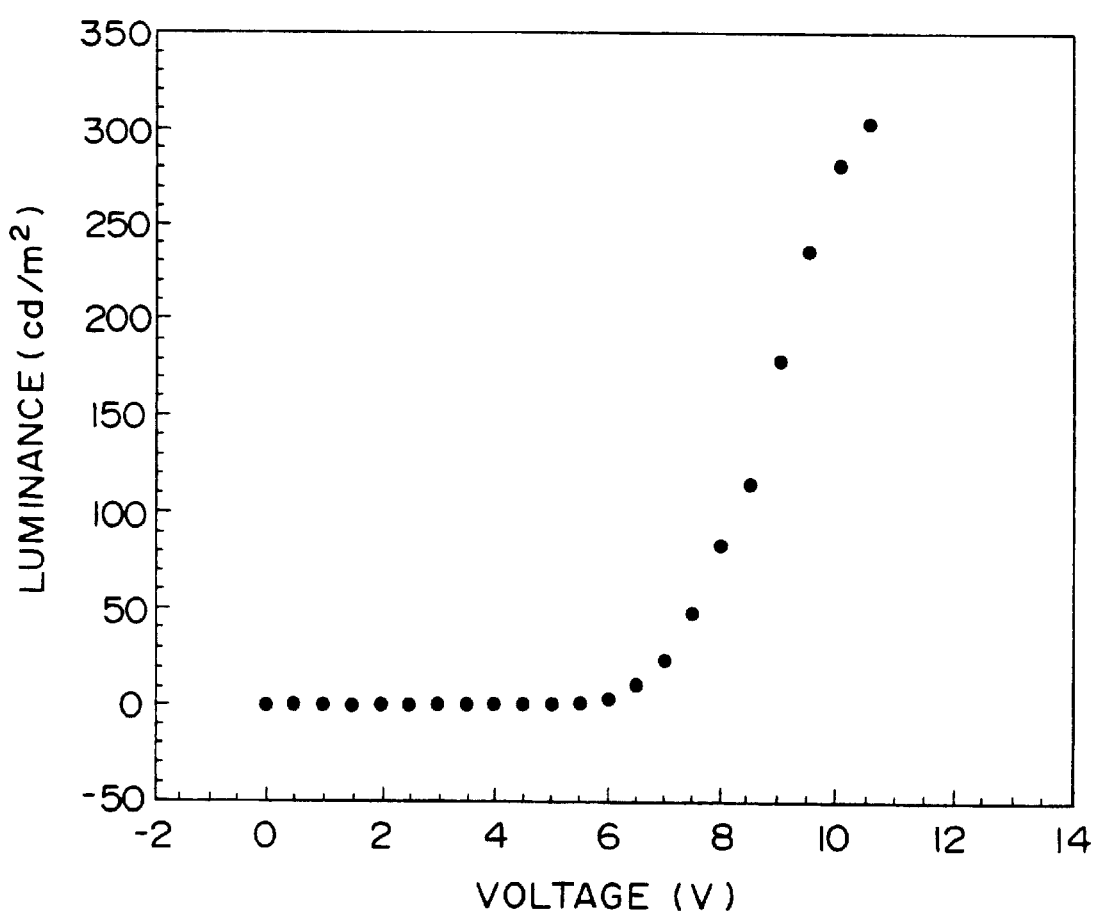

F I G. 30
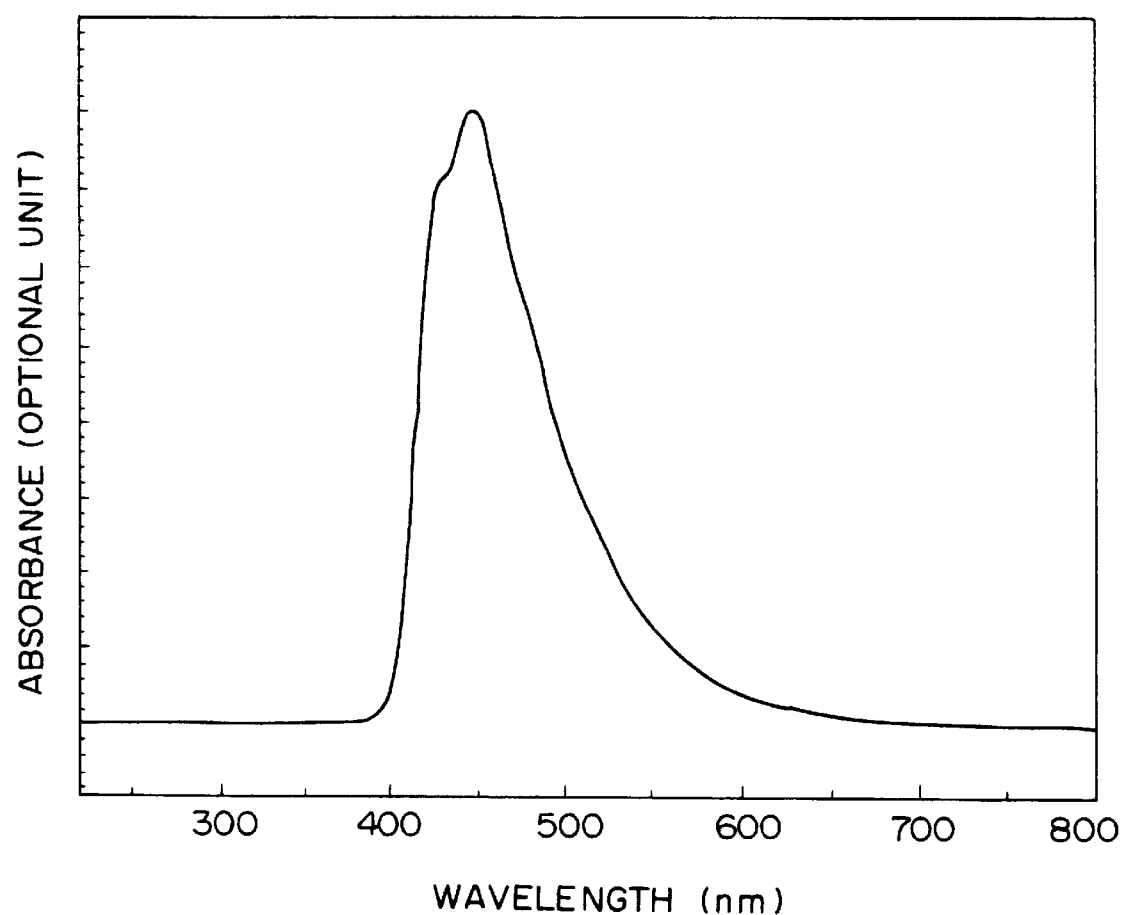

F I G. 31
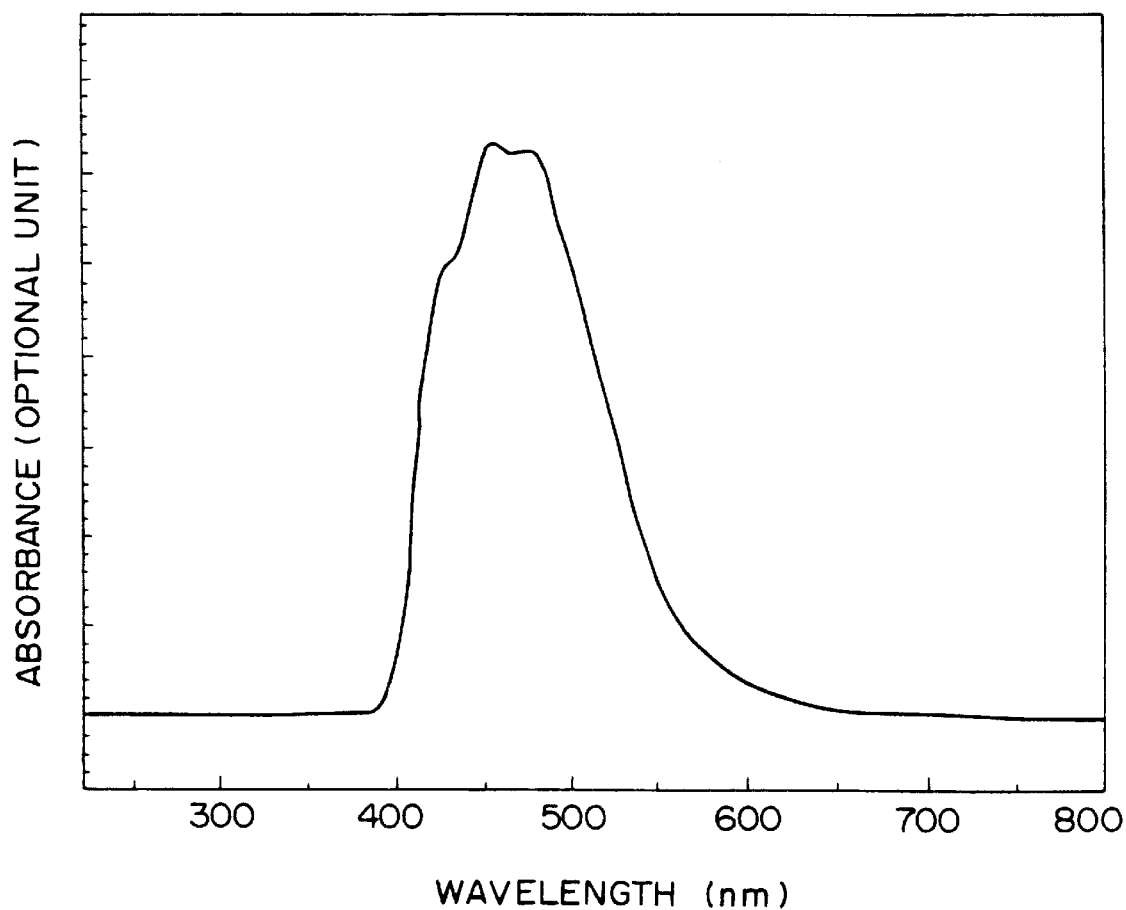

F I G. 32
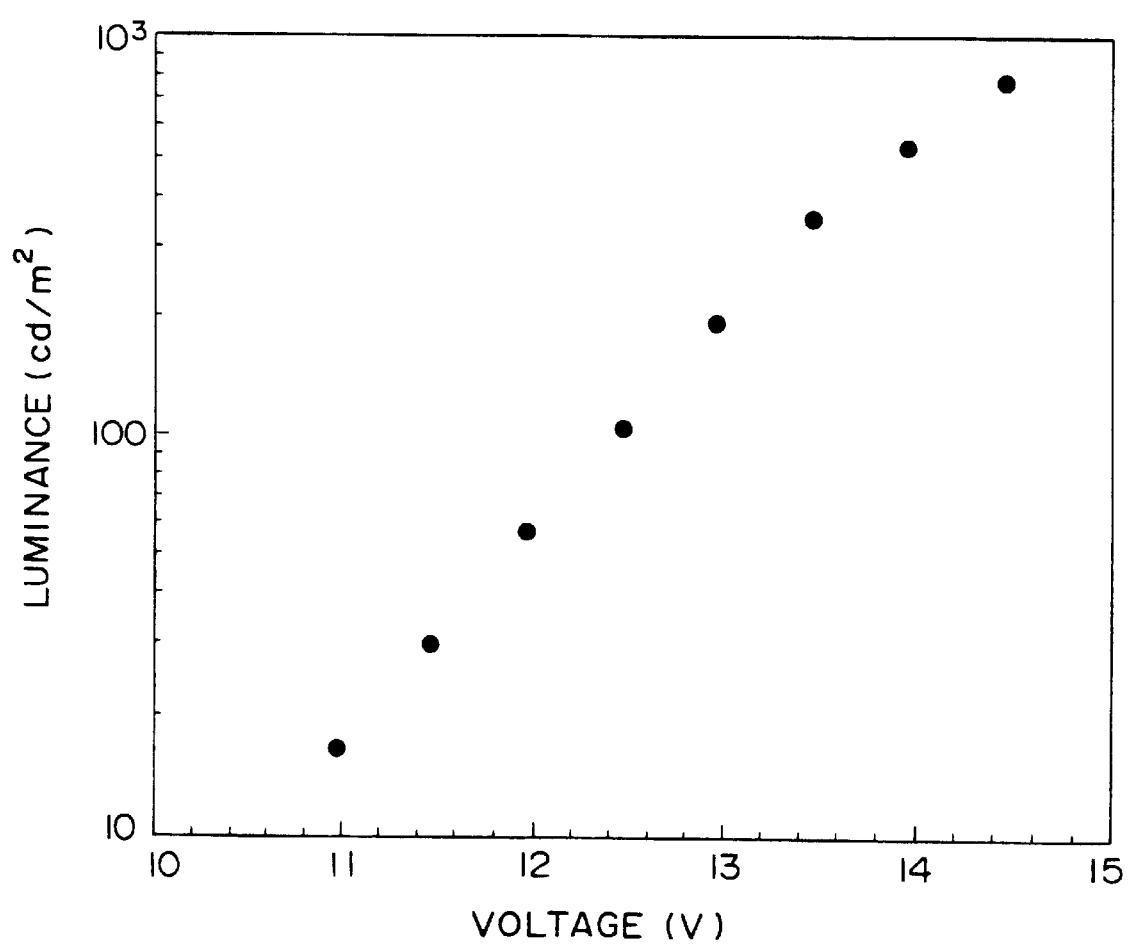

ELECTROLUMINESCENT DEVICE

BACKGROUND OF THE INVENTION

The present invention relates to an electroluminescent device, such as a self-luminescent plane display, and, more particularly, to an electroluminescent device suitable for an organic electroluminescent display employing an organic thin film as an electroluminescent layer.

The importance of man-machine interfaces including multimedia products has increased in recent years. It is necessary to take out a sufficient quantity of information correctly, simply and instantaneously from a machine to enable an operator to operate the machine efficiently and agreeably. Efforts have been made to develop various display devices. The progressive miniaturization of machines has amplified demand for the reduction in size and thickness of display devices. For example, the miniaturization of lap-top information processors integrally provided with a display device, such as notebook personal computers and notebook word processors has made an astonishing progress in recent years, and marvelous technological innovation has been achieved in liquid crystal displays suitable for such lap-top information processors to deal with the miniaturization of lap-top information processors.

In these days, the liquid crystal display is used as an interface for various daily products including lap-top information processors, small television receivers, watches and pocket calculators, not to mention lap-top information processors. Liquid crystal displays are characterized by their capability of being driven by power of a relatively low voltage and of operating at a relatively low power consumption. Studies of display devices have been made to develop display devices having large capacities as well as small capacities for use in man-machine interfaces. However, a liquid crystal display needs more power for driving its backlight unit than for driving its liquid crystal unit because the liquid crystal display is not self-luminescent. Therefore, the liquid crystal display is able to operate only a short period of time where powered by an internal battery or the like, which is a restriction on the use of the liquid crystal display. The liquid crystal display is not suitable for use as a large display because the liquid crystal display has a narrow viewing angle. It is a significant problem in the liquid crystal display that the contrast of a picture displayed on the liquid crystal display varies with the angle of viewing direction even within the viewing angle because the liquid crystal display forms pictures by changing the orientation of liquid crystal molecules. Although an active matrix driving system is able to operate at a response speed sufficiently high to deal with animated pictures, defects in pixels makes the formation of a large screen impossible because the active matrix driving system employs a thin-film transistor (TFT) driving circuit. The employment of a TFT driving circuit is not desirable from the viewpoint of cost reduction.

A simple matrix driving system is inexpensive and a liquid crystal display of a simple matrix driving system having a large screen size can be relatively easily fabricated. However, the response speed of the simple matrix driving system is not high enough to deal with animated pictures.

Studies have been made to develop self-luminescent display devices, such as plasma display devices, inorganic electroluminescent displays and organic electroluminescent displays. The plasma display device uses plasma light produced by discharge in a low-pressure gas and is suitable for forming large displays of a large capacity. However, the plasma display device has problems in thickness reduction and cost reduction. The plasma display device needs a high ac bias voltage and hence the plasma display device is not suitable for use in portable machines. The inorganic electroluminescent device is commercially used in displays of green luminescence. However, the inorganic electroluminescent device, similarly to the plasma display device, needs a high ac bias voltage and needs driving power of several hundreds of volts, which is disadvantageous to the practical application of the inorganic electroluminescent device.

The development of relevant technology has enabled the inorganic electroluminescent device to display color pictures in three primaries, i.e., red (R), green (G) and blue (B). However, since the inorganic electroluminescent device uses an inorganic material, it is difficult to control the wavelength of light to be emitted by the inorganic electroluminescent device and to display full-color pictures. Studies of electroluminescence of an organic compound have been made for a long time since the discovery of luminescence of an anthracene crystal resulting from injection of carriers into the anthracene crystal. However, since the luminescence of an anthracene crystal is of a low luminance and monochromatic, only basic studies of carrier injection into an organic material have been made.

Tang et al. of Eastman Kodak published an organic thin-film electroluminescent device of a laminated structure having an amorphous luminescent layer capable of emitting light in a high luminance and of being driven by power of a low voltage in 1987. Since then, active studies have been made to achieve light emission in three primaries, i.e., red, green and blue, stable light emission and luminance enhancement, and efforts have been made to develop suitable laminated structures and fabricating processes.

New organic materials have been invented through molecular design and active studies have been started to enable the application of thin organic electroluminescent display devices having excellent characteristics including self-luminescence to color displays.

The organic electroluminescent device (hereinafter, referred to also as "organic EL device") has a film of $\mu$m or below in thickness which become luminescent by converting electric energy into optical energy when a current is supplied thereto, which is an ideal property for a self-luminescent display device.

FIG. 33 shows a conventional organic EL device 10 by way of example. The organic EL device 10 is fabricated by sequentially forming a transparent electrode 5 of ITO (indium tin oxide), i.e., an anode, a hole transport layer 4, a light emitting layer 3, an electron transport layer 2 and a cathode 1, such as an aluminum electrode, in that order on a transparent substrate 6, such as a glass plate by, for example, vacuum evaporation processes. When a dc voltage 7 is applied selectively across the transparent electrode 5, i.e., an anode, and the cathode 1, holes, i.e., charge carriers, injected by the transparent electrode 5 move through the hole transport layer 4, electrons injected by the cathode 1 move through the electron transport layer 2, and holes and electrons recombine. When holes and electron recombine, light 8 of a predetermined wavelength can be seen through the transparent substrate 6.

The light emitting layer 3 may be made of a luminescent substance, such as anthracene, naphthalene, phenanthrene, pyrene, chrysene, perylene, butadiene, coumarin, acridine, stilbene or the like. The electron transport layer 2 may contain such a luminescent substance.

FIG. 34 shows another conventional organic EL device 20. the organic EL device 20 is not provided with any layer corresponding to the light emitting layer 3 of the foregoing organic EL device 10, has an electron transport layer 2 containing a foregoing luminescent substance, and emits light 18 of a predetermined wavelength from an interface between the electron transport layer 2 and a hole transport layer 4.

FIG. 35 shows a concrete example of the foregoing organic EL device. A laminated structure of the organic layers, i.e., the hole transport layer 4, and the light emitting layer 3 or the electron transport layer 2, are sandwiched between the cathode 1 and the anode 5. The cathode 1 has conductive strips extending in a direction, and the anode 5 has conductive strips extending in a direction perpendicular to the conductive strips of the cathode 1. Points of overlap of the conductive strips of the cathode 1 and the anode 5 constitute pixels. A signal voltage is applied across the pixels by a luminance signal circuit 34 and a controller 35 with a built-in shift resister controls the signal voltage in a time series to make the pixels emit light. The organic EL device can be used as an image reproducing device and, naturally, as a display. If the organic EL device is provided with sets each of the intersecting conductive strips for R, G and B, respectively, the organic EL device can be used as a full-color or multicolor display. In a display employing such an organic EL device having a plurality of pixels, the layers 2, 3 and 4 of organic thin films, in general, are sandwiched between the transparent electrode 5 and the cathode 1, i.e., a metal electrode, and light is emitted through the transparent electrode 5.

However, the foregoing organic EL device has problems to be solved. For example, it is essential when applying an organic EL device to a color display that the organic EL device is capable of stably emitting light rays of three primary colors, i.e., red, green and blue. However, there has been no report about materials capable of stably emitting red or blue light rays of satisfactory chromaticity in a satisfactory luminance, only those that emit green light rays. At present, it is particularly difficult to emit blue light stably because blue light emission involves heat generation by a heat relaxation process accompanying light emission and the existence of singlet oxygen. A coloring matter having a high crystallinity produces a polymer when it solidifies, so that the wavelength of the light emitted by the coloring matter increases and the coloring matter is unable to sustain light emission.

Many studies have been made for the development of new blue light emitting materials. Achievement of stable light emission by existing materials is important as well as the research and development of new substances. The use of substances of established properties as materials contributes greatly to the curtailment of research and development activities and provides guidelines on the development of materials. A coumarin laser coloring matter having a high fluorescence yield can be used as a doping material for improving the color purity of green light emission. It is reported that a coumarin laser coloring matter could be used as a blue light emitting material. Although a coumarin short-wavelength fluorescent coloring matter as a simple substance, in general, has a high crystallinity and an amorphous coumarin short-wavelength fluorescent coloring matter is not a suitable, stable blue light emitting material, a stable amorphous thin film can be formed by coevaporation. For example, fluorescent light emitted by coumarin 450 has a maximum wavelength of about 446 nm and has chromaticity corresponding to blue. However, since coumarin does not have properties to transport electrons or holes, the light emitting characteristics of coumarin is apparently inferior to those of materials having properties to transport electrons or holes. When a material, typically, zinc complex, is used, stable blue light emission can be achieved by forming an electron transporting blue light emitting layer in a single heterostructure. However, the intensity of light having a spectrum around 700 nm in which visual sensitivity is high increases when the voltage of power is increased to make the blue light emitting layer emit light in a sufficient luminance. Consequently, the chromaticity of the blue light changes adversely and the blue light emitting layer tends to emit light in a white light emitting mode. Generally, since organic EL devices have a relatively short life, active studies have been made in various fields for the extension of the life of organic EL devices. Preferably, the organic EL device has a half value time, i.e., a time period in which its initial luminance (about 200 cd) decreases by half, of 10,000 hr or above to enable the organic EL device to be used as a display. However, such a long half value time has not yet been achieved, which is a significant problem to be solved to enable the practical application of organic EL devices.

SUMMARY OF THE INVENTION

Accordingly, it is an object of the present invention to provide an electroluminescent device capable of emitting satisfactory blue light of a good chromaticity in a high light emitting efficiency in a high luminance, and of stably emitting light for a long time.

The inventors of the present invention examined those problems in the prior art earnestly and have made the present invention on the basis of a finding that time necessary for research and development can effectively be cut down, the existing, established materials can be used for fabricating full-color color displays and an organic EL device having an extended life can be developed if it is possible to make an amorphous thin film of one of the existing, established materials emit light of a good chromaticity efficiently in a high luminance.

The present invention provides an EL device comprising an exciton generation promoting layer for promoting the generation of excitons in light emitting regions by electron-hole recombination, formed over the light emitting regions.

In the EL device of the present invention, the exciton generation promoting layer enables a hole transport layer to generate excitons efficiently, so that stable, high-luminance light emission, particularly, blue light emission, can be achieved by low-voltage driving.

Accordingly, the present invention provides an EL device (more particularly, a low-voltage-driven, self-luminescent, thin amorphous organic EL device) of a construction in which a hole transport layer serves also as a light emitting layer serving also as an exciton generating region, having a long life and capable of maintaining stable light emission for a long time, which has been regarded as a difficult construction because any electron transport materials having an excellent nonluminescent property have not been available.

In an EL device according to the present invention, it is desirable that light emitting regions mainly are portions of an organic hole transport layer, and an organic exciton generation promoting layer is laminated contiguously with the hole transport layer.

In the EL device according to the present invention, it is desirable that the exciton generation promoting layer is formed between the hole transport layer and an electron transport layer.

In the EL device according to an embodiment of the present invention, it is desirable that the highest occupied molecular orbital level of the exciton generation promoting layer is not higher than the energetically lower one of the highest occupied molecular orbital levels of the hole transport layer and the electron transport layer.

In the EL device according to the present invention, it is desirable that the lowest unoccupied molecular orbital level of the exciton generation promoting layer is not energetically lower than the lower one of the respective lowest unoccupied molecular orbital levels of the hole transport layer and the electron transport layer, and not higher than the energetically higher lowest unoccupied molecular orbital level.

In the EL device according to the present invention, it is desirable that the exciton generation promoting layer is made of a poorly luminescent material having a low fluorescence yield.

In the EL device according to the present invention, it is preferable that the exciton generation promoting layer is formed of a nonluminescent material having a low fluorescence yield to prevent the generation of exciplexes in the interface between the exciton generation promoting layer and the hole transport layer, i.e., to prevent the reduction of light emitting efficiency, which, however, is not a restriction on the exciton generation promoting layer.

A phenanthroline derivative shown in FIG. 2 is a suitable material for forming the exciton generation promoting layer. Examples of possible materials for forming the exciton generation promoting layer are those having a structural formula 1 shown in FIG. 3, a structural formula 2 shown in FIG. 4, a structural formula 3 shown in FIG. 5, a structural formula 4 shown in FIG. 6, a structural formula 5 shown in FIG. 7, a structural formula 6 shown in FIG. 8, a structural formula 7 shown in FIG. 9, a structural formula 8 shown in FIG. 10, a structural formula 9 shown in FIG. 11 and a structural formula 10 shown in FIG. 12.

It is desirable to form a hole injection layer between the transparent electrode and the organic hole transport layer. Preferably, the thickness of the hole injection layer is 300 nm or below, more preferably, 250 nm or below.

Preferably, the EL device is fabricated by sequentially laminating a transparent electrode, an organic hole transport layer, an organic exciton generation promoting layer, an organic electron transport layer and a metal electrode in that order on an optically transparent substrate.

Thus, the electroluminescent device is an organic electroluminescent device suitable for a color display.

BRIEF DESCRIPTION OF THE DRAWINGS

The above and other objects, features and advantages of the present invention will become more apparent from the following description taken in connection with the accompanying drawings, in which:

FIG. 3 is a structural formula 1 of a phenanthroline derivative for forming an exciton generation promoting layer;

FIG. 4 is a structural formula 2 of a phenanthroline derivative for forming an exciton generation promoting layer;

FIG. 5 is a structural formula 3 of a phenanthroline derivative for forming an exciton generation promoting layer;

FIG. 9 is a structural formula 7 of a phenanthroline derivative for forming an exciton generation promoting layer;

FIG. 10 is a structural formula 8 of a phenanthroline derivative for forming an exciton generation promoting layer;

FIGS. 18A to 18C show other hole transport light emitting materials, in which FIG. 18A is a structural formula of α-PPD, FIG. 183 is a structural formula of α-TPD, and FIG. 18C is a structural formula of TPD;

FIG. 22 is a graph showing the spectral characteristic of the organic EL device in the first embodiment;

FIG. 24 is a graph showing the spectral characteristic of the organic EL device in the second embodiment;

FIG. 26 a graph showing the voltage-luminance characteristic of the organic EL device in the second embodiment;

FIG. 30 is a graph showing the spectral characteristic of the organic EL device in the fourth embodiment;

FIG. 31 is a graph showing the spectral characteristic of the organic EL device in the ninth embodiment;

FIG. 32 is a graph showing the voltage-luminance characteristic of the organic EL device in the eleventh embodiment;

DETAILED DESCRIPTION OF THE PREFERRED EMBODIMENTS

[First Embodiment]

Figure 1:
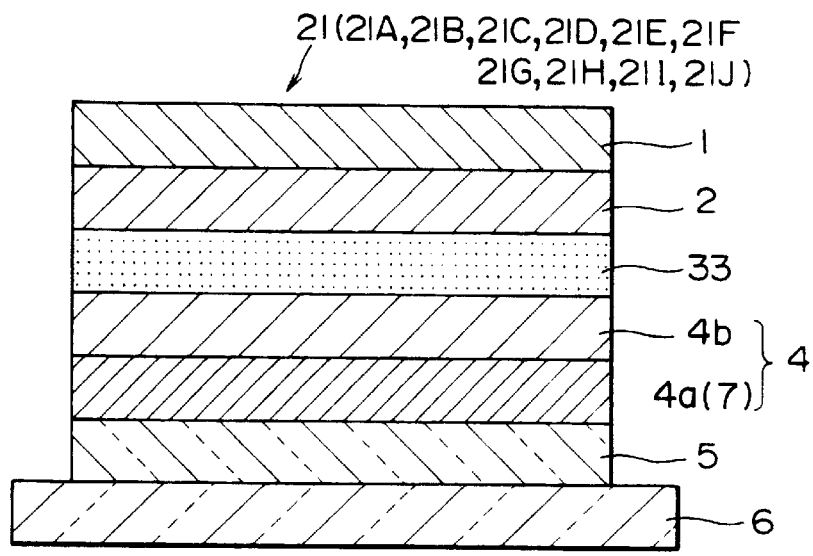
FIG. 1 is a cross-sectional view of an essential portion of an organic EL device in first and fourth to thirteenth embodiments according to the present invention.

FIG. 1 is a typical sectional view of an essential portion of a blue light emitting organic EL device in a first embodiment according to the present invention. As shown in FIG. 1, a transparent electrode 5 of ITO (indium tin oxide) is formed by sputtering on a surface of a glass substrate 6. Then, a first hole transport light emitting layer 4a, a second hole transport light emitting layer 4b, an exciton generation promoting layer 33, an electron transport layer 2 and a cathode 1 are formed sequentially in that order by vacuum evaporation on the transparent anode 5 to complete an organic EL device 21 comprising amorphous organic thin films. The organic EL device 21 is of a single heterostructure using the hole transport layer 4 as a light emitting layer. The respective basic constructions of organic EL devices in other embodiments which will be described below are similar to that of the organic EL device 21. The organic EL device 21 in the first embodiment is characterized by the exciton generation promoting layer 33 sandwiched between the hole transport layer 4 and the electron transport layer 2. The exciton generation promoting layer 33 promotes the generation of excitons in the hole transport layer 4 at an improved efficiency for light emission.

Figure 13:
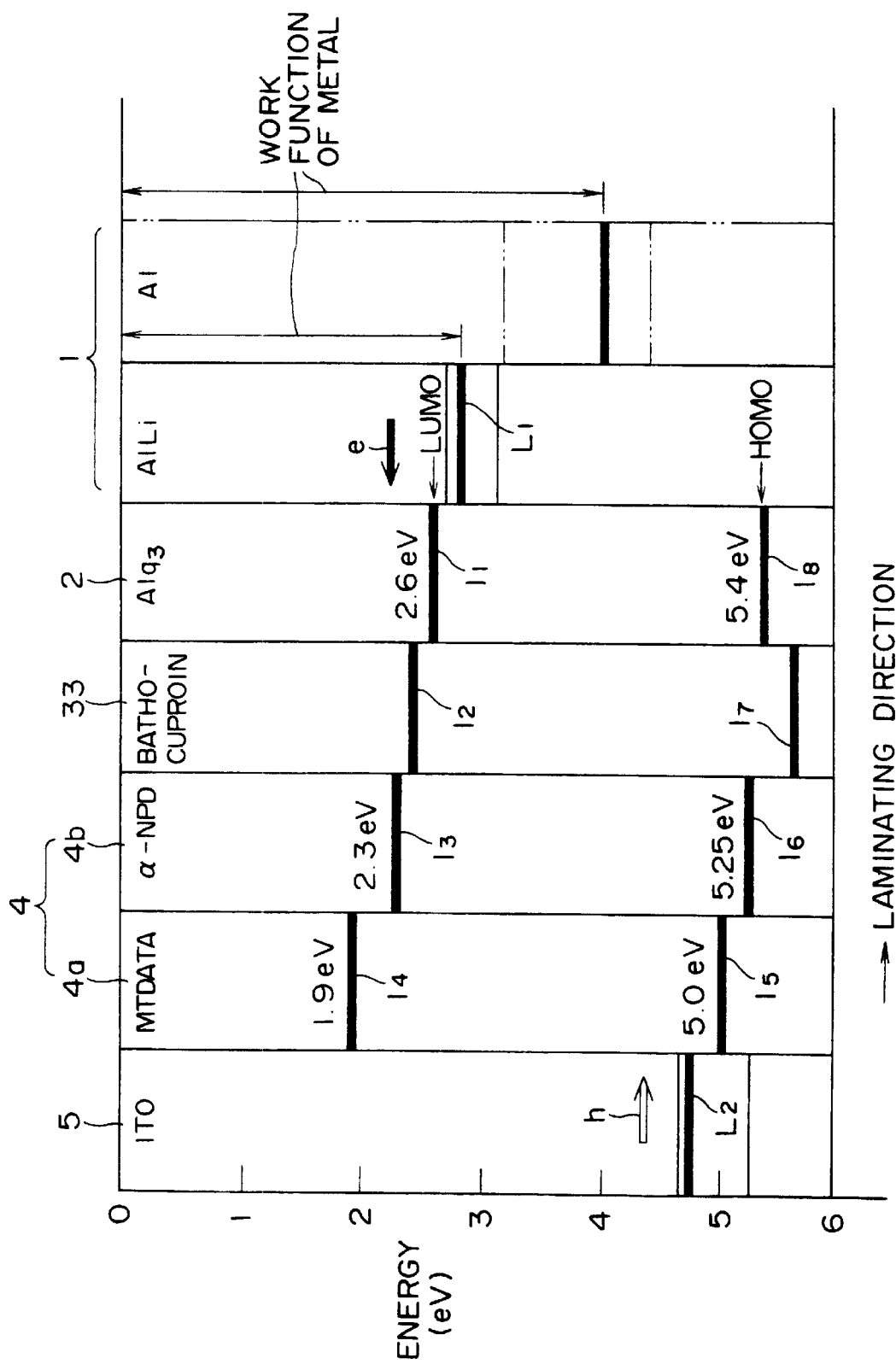
FIG. 13 is a typical view of a band model of the laminated multilayer structure of the organic EL device of FIG. 1.

FIG. 13 is a typical view of a band model of the laminated multilayer structure of the first embodiment (FIG. 1). Referring to FIG. 13, thick lines L1 and L2 indicated in the cathode 1 of Al and Al—Li (aluminum-lithium) and the transparent anode 5 of ITO are the approximate work functions of the metals of the cathode 1 and the transparent anode 5, respectively. Upper thick lines $l_1$, $l_2$, $l_3$ and $l_4$ indicated in the layers sandwiched between the cathode 1 and the anode 5 are the levels of lowest unoccupied molecular orbits (LUMOs), and values indicated on the thick lines $l_5$, $l_6$, $l_7$ and $l_8$ indicate the levels of highest occupied molecular orbits (HOMOs). The values of energy levels shown in FIG. 13 are only examples and are dependent on materials. As shown in FIG. 13, in the organic EL device, holes h injected from the transparent anode 5 move through the hole transport layer 4, electrons e injected from the cathode 1 move through the electron transport layer 2, and the holes h and the electrons e recombine in the hole transport layer 4 to emit light. The electrons e injected from the cathode 1, i.e., a metal electrode, have a tendency to move toward a region of a lower energy level. Therefore, the electrons e are able to move sequentially through the cathode 1, the electron transport layer 2, the exciton generation promoting layer 33, the second hole transport light emitting layer 4b, and the first hole transport light emitting layer 4a through the levels $l_1$ to $l_4$ of the lowest unoccupied molecular orbits (LUMOS) and to reach the hole transport light emitting layers 4b and 4a. The holes h injected from the transparent anode 5 of ITO have a tendency to move toward a region of a higher energy level. Therefore, the holes h is able to move sequentially to the electron transport layer 2 through the first hole transport light emitting layer 4a, the second hole transport light emitting layer 4b and the exciton generation promoting layer 33 through the levels $l_5$ to $l_7$ of the highest occupied molecular orbits (HOMOs). However, as shown in FIG. 13, since the level $l_8$ of the HOMO of the electron transport layer 2 is energetically lower than the level $l_7$ of the HOMO of the exciton generation promoting layer 33, the movement of the injected holes h from the exciton generation promoting layer 33 into the electron transport layer 2 is difficult, and the exciton generation promoting layer 33 is filled up with the holes h. Consequently, the holes h filling up the exciton generation promoting layer 33 promote the generation of excitons in the hole transport layer 4 and give light emitting energy to the luminescent materials forming the component hole transport light emitting layers 4a and 4b of the hole transport layer 4. The exciton generation promoting layer 33 controls the transportation of holes h effectively so that excitons are generated efficiently in the hole transport layer 4. Thus, the light of a specific wavelength (blue light) as shown in FIG. 22 is emitted by the addition of main light emitted by the second hole transport light emitting layer 4b contiguous with the exciton generation promoting layer 33 and light emitted by the first hole transport light emitting layer 4a. Essentially, the electron transport layer 2 and the hole transport layer 4 have a function to generate excitons when electrons are injected from the cathode 1 and holes are injected from the anode 5. Therefore, excitons are generated in the interface between the electron transport layer 2 and the hole transport layer 4 if the organic EL device 21 is not provided with the exciton generation promoting layer 33, and hence only light of a long wavelength can be emitted. Since the organic EL device 21 in this embodiment is provided with the exciton generation promoting layer 33, the emission of blue light from the hole transport layer 4 containing a luminescent substance as a light emitting region can be promoted.

As mentioned above, the exciton generation promoting layer 33 controls the transportation of holes h. Therefore, the construction of the organic EL device is not limited to the foregoing construction provided that the level of the HOMO of the exciton generation promoting layer 33 is not higher than the level of the HOMO of the energetically lower one of the hole transport light emitting layers 4a and 4b and the electron transport layer 2, the level of the LUMO of the exciton generation promoting layer 33 is not lower than the level of the LUMO of the energetically lower one of the hole transport light emitting layers 4a and 4b and the electron transport layer 2 and not higher than the level of the LUMO of the energetically higher one of the hole transport light emitting layers 4a and 4b and the electron transport layer 2.

Various materials are applicable to forming the exciton generation promoting layer 33, and the exciton generation promoting layer 33 may be formed in any thickness in a thickness range capable of assuring the function of the exciton generation promoting layer 33. Preferably, the thickness of the exciton generation promoting layer 33 is in the range of 1 to 1000 Å (0.1 to 10 nm). The exciton generation promoting layer 33 may possibly melt when the organic EL device 21 is driven if the exciton generation promoting layer 33 is excessively thin, and the exciton generation promoting layer 33 has a high withstand voltage but luminance is liable to be reduced if the exciton generation promoting layer 33 is excessively thick.

Figure 14:
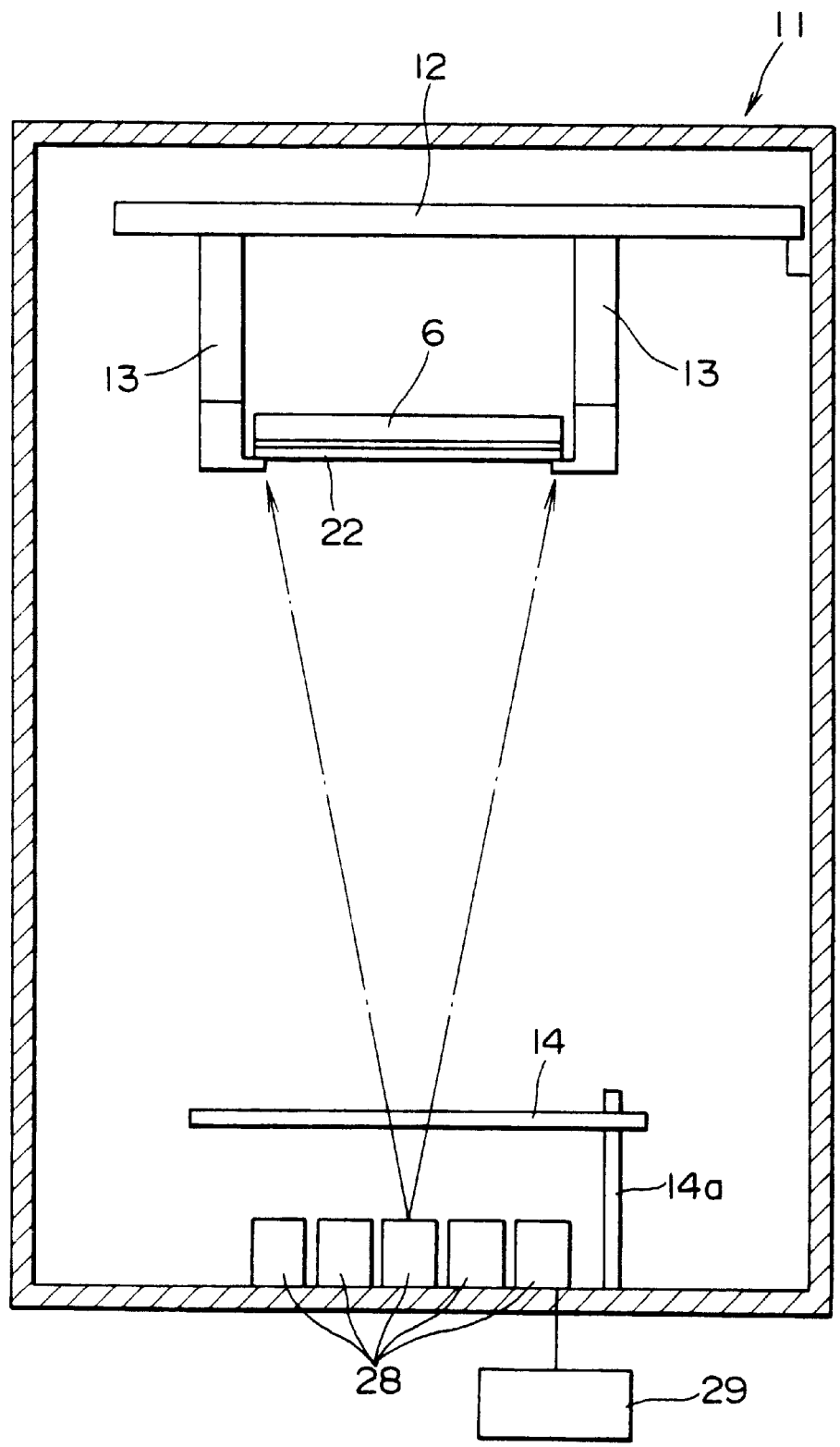
FIG. 14 is a schematic sectional view of a vacuum evaporation system employed in fabricating the organic EL device of FIG. 1.

A vacuum evaporation system 11 shown in FIG. 14 is used for fabricating the organic EL device 21. In a vacuum vessel, a pair of support means 13 are fixed to the lower surface of an arm 12. A stage mechanism, not shown, is disposed between the pair of support means 13. The stage mechanism holds the transparent glass substrate 6 with its working surface facing down, and sets a mask 22 on the working surface of the glass substrate 6. A shutter 14 is supported on a support shaft 14a under the glass substrate 6 and the mask 22, and a predetermined number of evaporation sources 28 are disposed under the shutter 14. The evaporation sources 28 are heated by resistance heating using power supplied by a power source 29. If necessary, the evaporation sources 28 may be heated by EB (electron beam) heating. In this vacuum evaporation system, the mask 22 is used for forming pixels, and the shutter 14 is used for controlling evaporation materials. The shutter 14 is turned on the support shaft 14a to intercept the flow of vapors of the evaporation materials according to the sublimation temperatures of the evaporation materials.

Figure 15:
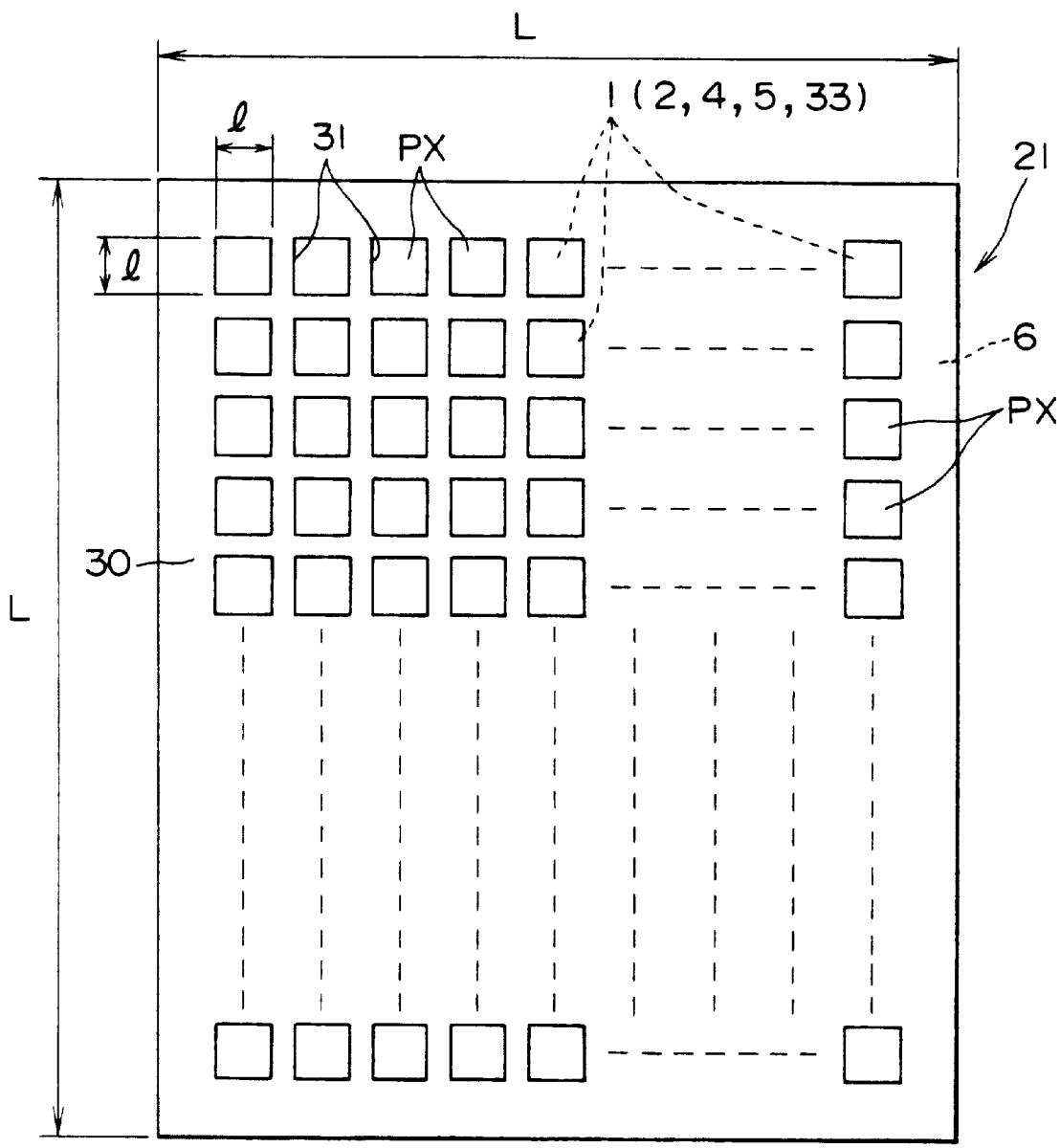
FIG. 15 is a plan view of the organic EL device of FIG. 1.

FIG. 15 shows, in a plan view, the organic EL device 21 fabricated by using the vacuum evaporation system 11 shown in FIG. 14. The ITO transparent anodes 5 of 2 mm by 2 mm are deposited in a thickness of about 100 nm on the glass substrate of 30 mm by 30 mm by the vacuum evaporation system 11. The surface of the transparent glass plate 6 is coated entirely with a $SiO_2$ film 30 formed by evaporation, a plurality of openings 31 are formed in a predetermined pixel pattern in the $SiO_2$ film 30 by etching so that the transparent anodes 5 corresponding to the openings 31 are exposed. The organic layers 4, 33 and 2 and the cathodes 1 are formed sequentially by using the evaporation mask 22 in light emitting regions (pixels) PX of 2 mm by 2 mm defined by the SiO2 film 30. The vacuum evaporation 11 is able to form a single pixel of a large size as well as the foregoing plurality of pixels shown in FIG. 15.

The organic EL device 21 having the hole transport layer 4, requiring a low-voltage driving power and capable of stably emitting light in a high luminance can be formed by employing the organic exciton generation promoting layer 33 for improving the efficiency of exciton generation by the recombination of electrons and holes in the light emitting regions. As regards the performance of the organic EL device 21 in emitting blue light in particular, the organic EL device 21 is capable of emitting light in a luminance of 10,000 $cd/m^2$ or above when driven by a dc current and of emitting light in a luminance of 55,000 $cd/m^2$ or above when driven by a pulse current at a duty factor of $1/100$, which will be described later.

The exciton generation promoting layer 33 may be of a multilayer construction consisting of a plurality of component layers. The transparent anode 5, the electron transport layer 2, the exciton generation promoting layer 33, the organic electron transport layer 2 and the cathode 1 may be multilayer structures, respectively, each consisting of a plurality of component layers.

The organic layers of the foregoing embodiments can be formed by a film forming process other than that using evaporation, such as sublimation or vaporization.

The hole transport layer 4 of the organic EL device may contain a small amount of molecules for controlling the spectrum of light emitted by the organic EL device 21 introduced into the hole transport light emitting layer 4 by coevaporation; that is, the hole transport layer 4 may be an organic thin film containing a small amount of an organic substance, such as a perylene derivative or a coumarin derivative.

Possible hole transport materials are benzine derivatives, styrylamine derivatives, triphenylmethane derivatives, porphyrin derivatives, triazole derivatives, imidazole derivatives, oxadiazole derivatives, polyarylalkane derivatives, phenylene diamine derivatives, arylamine derivatives, oxazole derivatives, anthracene derivatives, fluorenone derivatives, hydrazone derivatives, stilbene derivatives, and monomers, oligomers and polymers of heterocyclic conjugate compounds including polysilane compounds, vinylcarbazole compounds, thiophene compounds and aniline compounds.

More concretely, possible substances are porphyrin, metal tetraphenyl porphyrin, metal naphthalocyanine, 4,4',4"-trimethyl triphenylamine, N,N,N',N'-tetrakis (p-tolyl) p-phenylene diamine, N,N,N',N'-tetraphenyl-4,4'-diaminobiphenyl, N-phenyl carbazole, 4-di-p-tolylaminostilbene, poly(paraphenylenevinylene), poly (thiophenevinylene) and poly(2,2'-thienylpyrrole).

There is no particular restriction on the materials of the anode 5, the electron transport layer 2 and the cathode 1 of the EL device 21. The electron transport layer 2 may be formed of an electron transporting organic material, such as a perylene derivative, a bistyryl derivative, a pipyrazine derivative or the like.

Preferably, the cathode is made of a metal having a small work function to enable efficient electron injection. The cathode may be formed of, for example, a metal having a small work function, such as aluminum, indium, magnesium, silver, calcium, barium, lithium, or a stable alloy of one of those metals and another metal.

Although the anode 5 of the foregoing embodiment is formed of ITO, i.e., a transparent substance, to emit light by organic electroluminescence through the anode 5, the anode 5 may be formed of a substance having a large work function, such as gold, a mixture of tin dioxide and antimony, or a mixture of zinc oxide and aluminum, for efficient hole injection.

Monochromatic organic EL devices, full-color organic EL devices capable of R, G and B light, and multicolor organic EL devices can be fabricated by selectively using proper luminescent materials. The present invention is applicable not only to organic EL devices for use as a display, but also to organic EL devices for use as a light source, and organic EL devices for other optical uses.

The above-described monochromatic organic EL devices may be driven in a state being sealed with germanium oxide or the like for eliminating the effect of oxygen and the like in the atmospheric air or in a state being evacuated.

[Second Embodiment]

Figure 20:
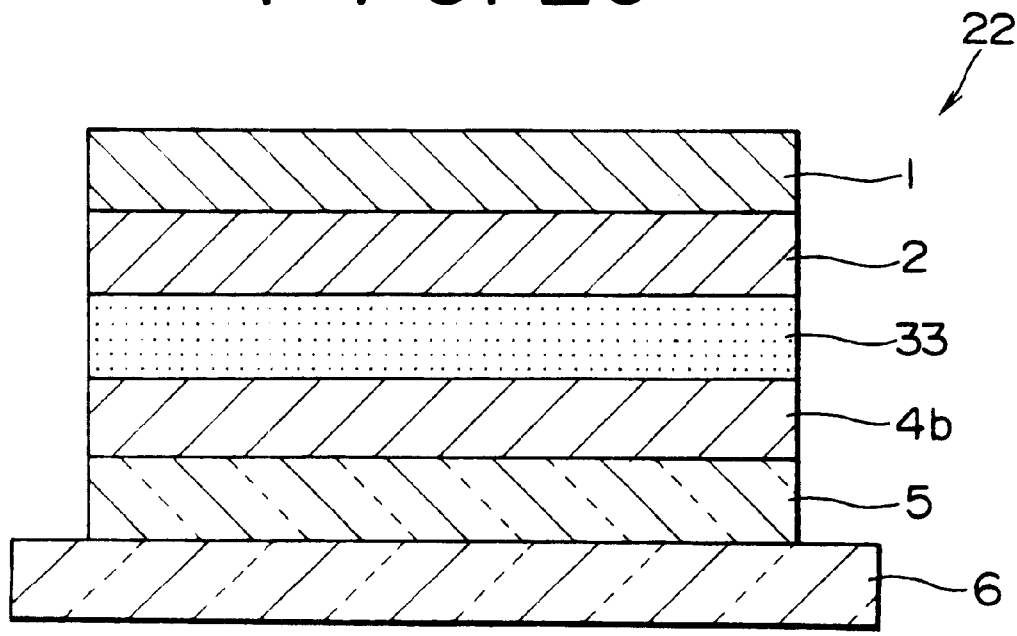
FIG. 20 is a cross-sectional view of an organic EL device in a second embodiment according to the present invention.

FIG. 20 is a typical sectional view of an essential portion of a organic EL device 22 in a second embodiment according to the present invention. The organic EL device 22 is provided with a single hole transport light emitting layer 4b formed on a transparent anode 5 of ITO, instead of the hole transport layer 4 consisting of two hole transport light emitting layers 4a and 4b of the organic EL device 21 in the first embodiment.

[Third Embodiment]

Figure 21:
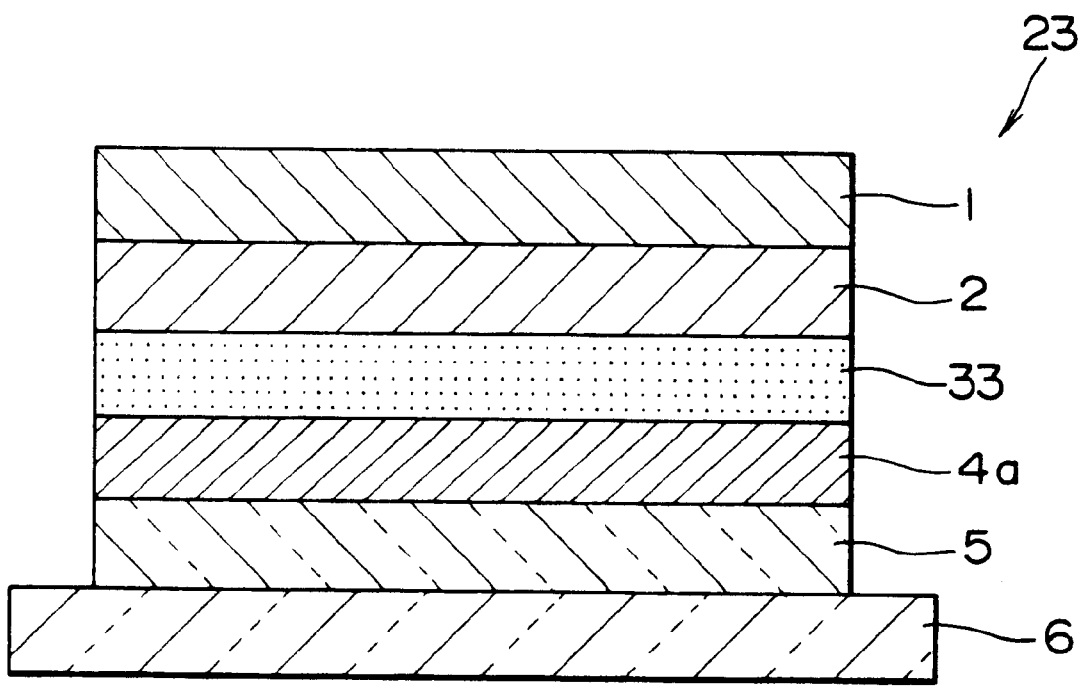
FIG. 21 is a cross-sectional view of an organic EL device in a third embodiment according to the present invention.

FIG. 21 is a typical sectional view of an essential portion of a organic EL device 23 in a third embodiment according to the present invention. The organic EL device 23 is provided with a single hole transport light emitting layer 4a formed on a transparent electrode 5 of ITO, instead of the hole transport layer 4 consisting of the hole transport light emitting layers 4a and 4b of the organic EL device 21 in the first embodiment.

[Fourth Embodiment]

An organic EL device 21A in a fourth embodiment according to the present invention is similar to the organic EL device 21 in the first embodiment, except that the organic EL device 21A is provided with a hole injection layer 7 formed on an anode 5, capable of injecting holes at a high hole injection efficiency and incapable of emitting light, instead of the hole transport light emitting layer 4a. Holes can efficiently be injected from the anode 5 into a hole transport light emitting layer 4b formed on the hole injection layer 7. Preferably, the thickness of the hole injection layer 7 is 300 nm or below, more preferably, 250 nm or below. The organic EL device 21A is able to emit light even if the same is not provided with the hole injection layer 7. However, experiments proved that the organic EL device 21A has an unsatisfactory light emitting characteristic and a relatively short life if the hole injection layer 7 is omitted and the hole transport light emitting layer 4b is formed directly on the anode 5, and that the hole injection layer 7 is effective in enhancing the light emitting efficiency of the organic EL device 21A and extending the life of the same. The hole injection layer 7 is effective even if the thickness of the same is on the order of a molecular size. The hole injection layer 7 made of an appropriate material improves the maximum luminance and enables the reduction of the driving voltage even if the same is formed in a thickness corresponding to the size of a single molecule or several molecules on the anode 5 by an OMB process (organic molecular beam epitaxy process) or an LB process (Langmuir-Blodgett process). Although there is no particular restriction on the material of the hole injection layer 7, it is preferable that the hole injection layer 7 is formed of a material having a HOMO between the work function of the anode 5 and the HOMO of the hole transport light emitting layer 4b and capable of making the anode 5 inject holes efficiently into the hole transport light emitting layer 4b. For example, holes are able to move even if the energy level of the HOMO of the hole injection layer 7 is higher than that of the HOMO of the hole transport light emitting layer 4b.

Embodiments of the present invention will concretely be described hereinafter.

[First Embodiment]

The organic EL device 21 of FIG. 1 will be described in terms of a method of fabricating the same. An about 100 nm thick transparent anode 5 of ITO was formed on a glass substrate 6 of 30 mm by 30 mm, and then an organic EL device forming cell having openings corresponding to light emitting regions of 2 mm by 2 mm were formed on the anode 5 by evaporation.

Figure 16:
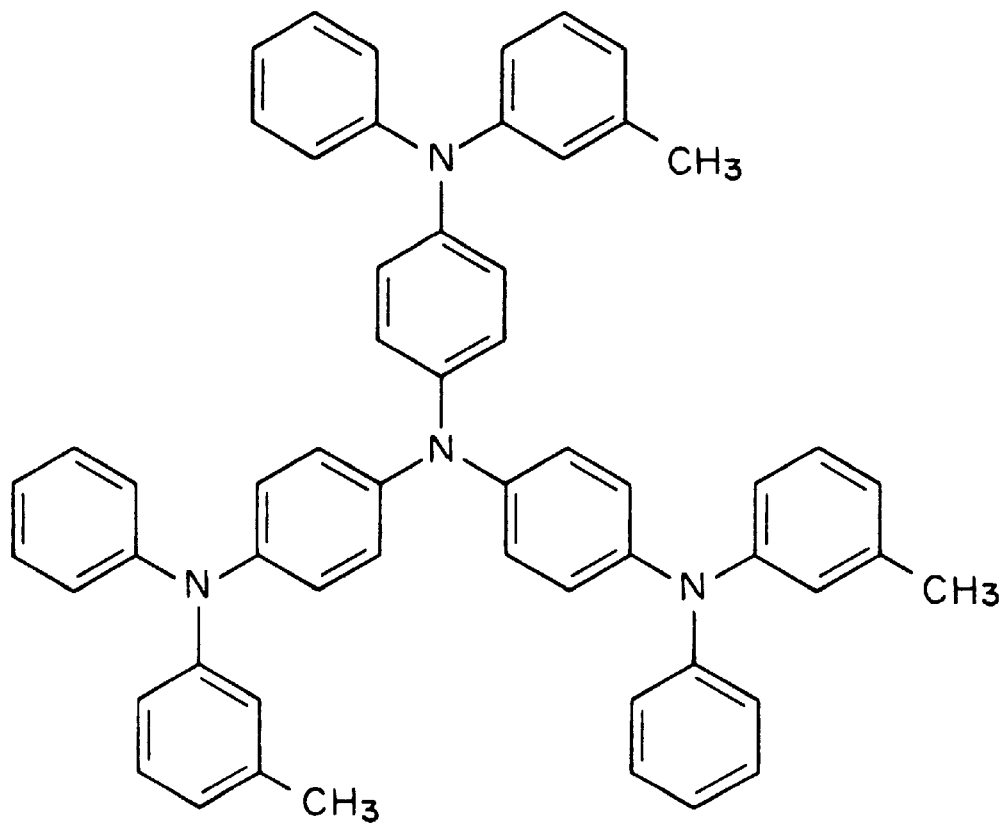
FIG. 16 is a structural formula of m-MTDATA (hole transport light emitting material) employed in the organic EL device of FIG. 1.

A 30 nm thick hole transport light emitting layer 4a of m-MTDATA (4,4',4"-tris 3-methylphenylphenylamino) triphenylamine expressed by a structural formula shown in FIG. 16 was formed on the transparent anode 5 of ITO in a vacuum by a vacuum evaporation process at a deposition rate of 0.2 to 0.4 nm/sec.

Figure 17:
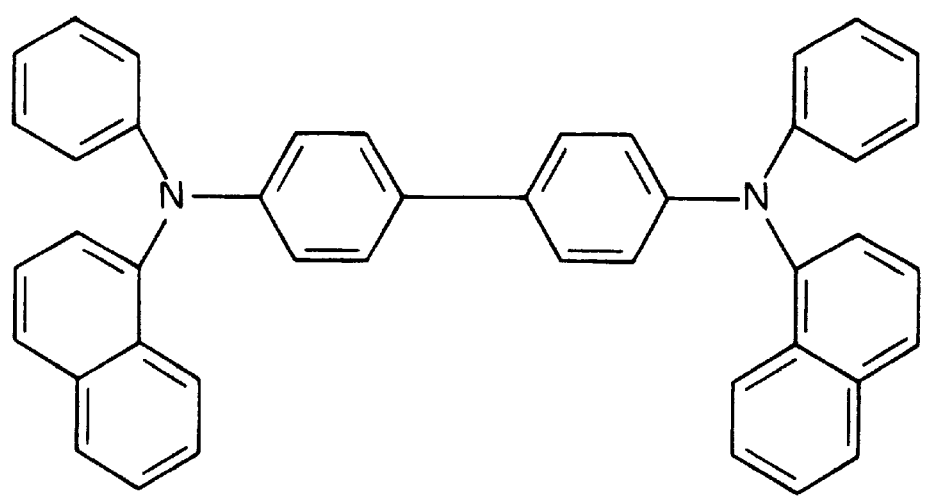
FIG. 17 is a structural formula of α-NPD (hole transport light emitting material) employed in the organic EL device of FIG. 1.

A 50 nm thick second hole transport light emitting layer 4b of α-NPD (α-naphthylphenyldiamine) having a structural formula shown in FIG. 17 was formed on the first hole transport light emitting layer 4a by evaporation at a deposition rate in the range of 0.2 to 0.4 nm/sec to construct a two-layer hole transport layer 4. A layer of α-PPD shown in FIG. 18A or α-TPD shown in FIG. 18B may be used instead of the layer of α-NPD.

Figure 2:
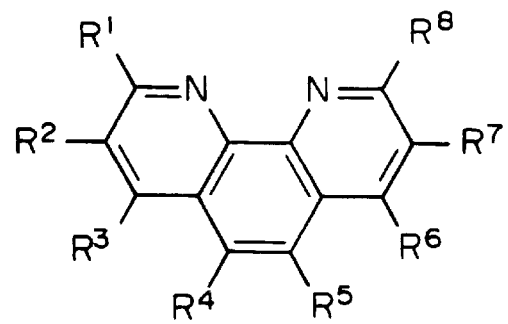
FIG. 2 is a general structural formula of a phenanthroline derivative for forming an exciton generation promoting layer.
Figure 6:
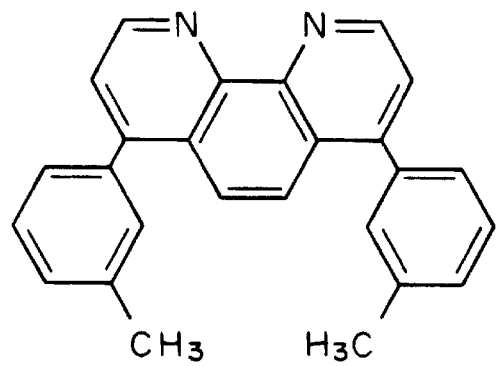
FIG. 6 is a structural formula 4 of a phenanthroline derivative for forming an exciton generation promoting layer.
Figure 7:
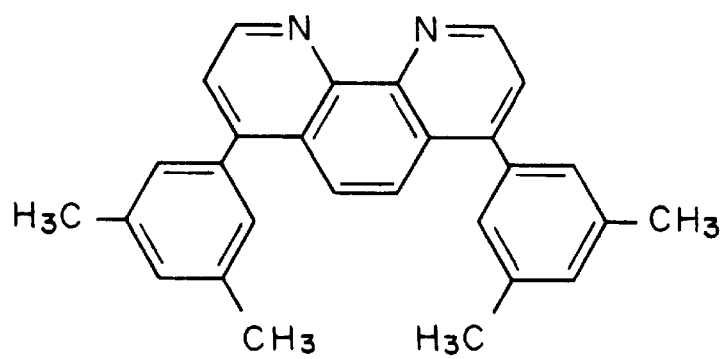
FIG. 7 is a structural formula 5 of a phenanthroline derivative for forming an exciton generation promoting layer.
Figure 8:
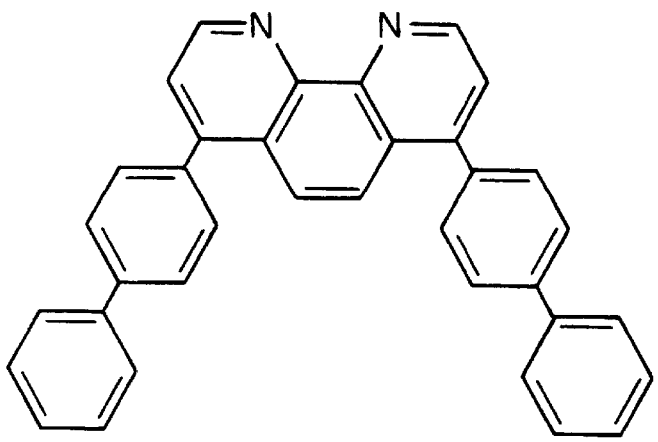
FIG. 8 is a structural formula 6 of a phenanthroline derivative for forming an exciton generation promoting layer.
Figure 11:
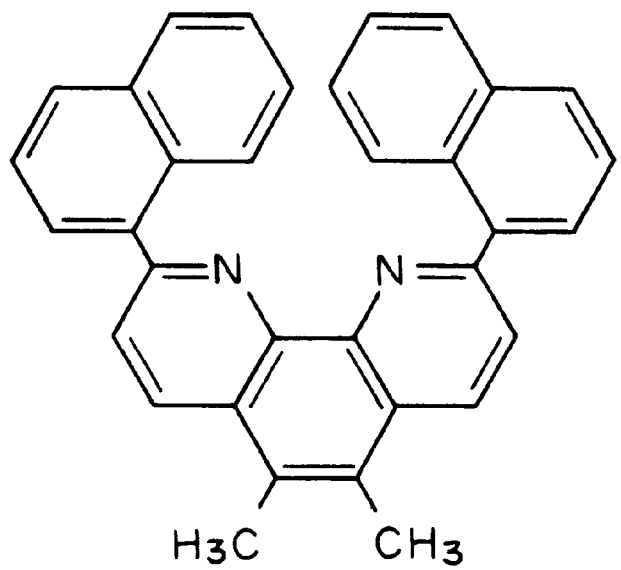
FIG. 11 is a structural formula 9 of a phenanthroline derivative for forming an exciton generation promoting layer.
Figure 12:
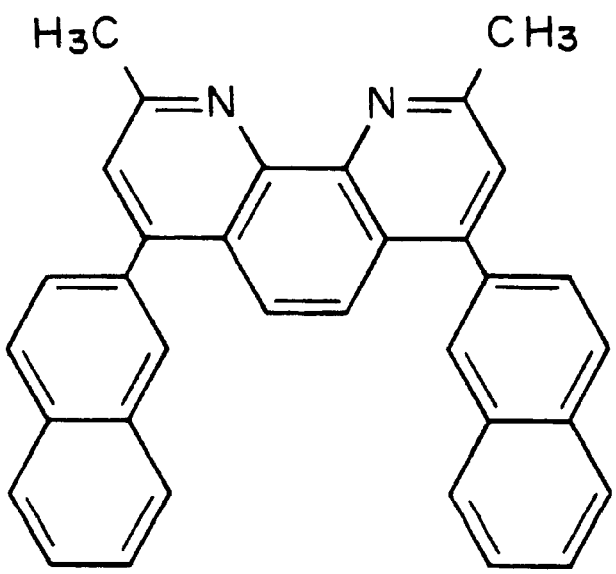
FIG. 12 is a structural formula 10 of a phenanthroline derivative for forming an exciton generation promoting layer.

A 15 nm thick exciton generation promoting layer (or an exciton generation efficiency improving layer) 33 was formed by depositing a phenanthroline derivative having a general structural formula shown in FIG. 2, such as bathocuproin (2,9-dimethyl-4,7-diphenyl-1,10-phenanthroline) having a structural formula 2 shown in FIG. 4 on the hole transport layer 4 by evaporation at a deposition rate in the range of 0.2 to 0.4 nm/sec.

Figure 19:
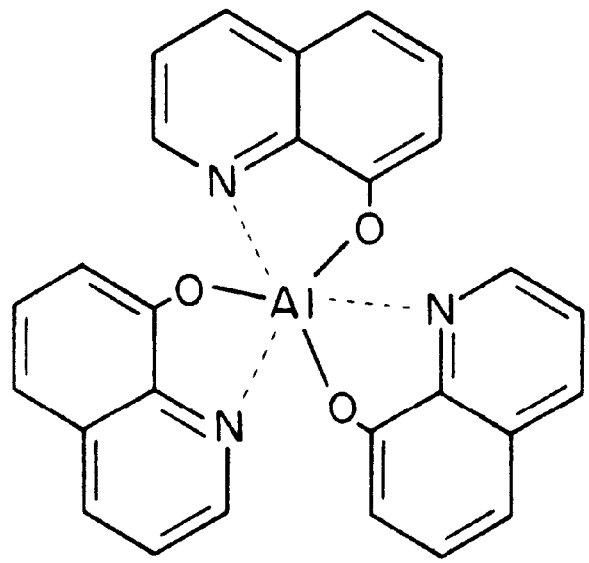
FIG. 19 is a structural formula of $Alq_3$ (electron transport material) employed in the first embodiment.

A 20 nm thick electron transport layer 2 was formed on the exciton generation promoting layer 33 by depositing Alq$_3$ (8-hydroxyquinoline aluminum) having a structural formula shown in FIG. 19 by evaporation. Finally, an about 200 nm thick cathode 1 was formed by depositing an aluminum-lithium alloy (about 1 mol % Li concentration) by evaporation to complete the blue light emitting organic EL device 21 shown in FIG. 1. The characteristics of the organic EL device 21 were measured.

Figure 23:
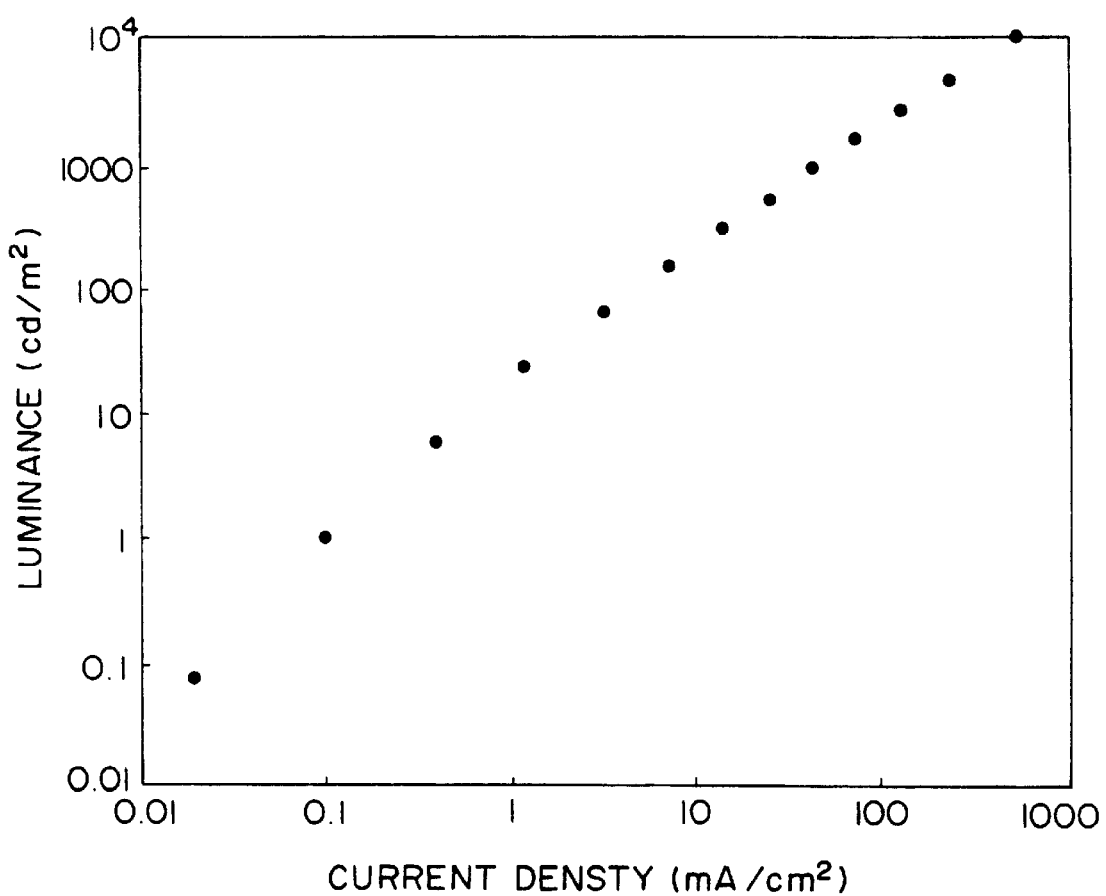
FIG. 23 is a graph showing the current-luminance characteristics of the organic EL device in the first embodiment.

FIG. 22 is a graph showing the spectral characteristics of the organic EL device 21 in the first embodiment shown in FIG. 1. A maximum emission wavelength corresponding to a peak absorbance is about 465 nm. The coordinates of light emitted by the organic EL device 21 on a CIE chromaticity coordinate system are (0.16, 0.2), which indicates that the light is satisfactory blue light. As shown in FIG. 23, the luminance was 10,000 cd/m$^2$ when current density was 500 mA/cm$^2$. Luminous efficiency was 1.21 m/W when current density was 1 mA/cm$^2$. It was obvious from the shape of the emission spectrum that the light was emitted by the hole transport light emitting layer 4b (FIG. 1) of α-NPD. When the organic EL device 21 was driven by a pulse drive signal of 1/100 in duty factor, luminance in terms of dc drive was 55,000 cd/m$^2$ when current density was 5,500 mA/cm$^2$, coordinates on a CIE chromaticity coordinate system was (0.15, 0.16), chromaticity was improved, and a practicably applicable, high-performance, high-luminance blue light emitting device could be fabricated.

[Second Embodiment]

The organic EL device 22 in the second embodiment according to the present invention will be described in terms of a method of fabricating the same.

An about 100 nm thick transparent anode 5 of ITO was formed on a glass substrate 6 of 30 m by 30 mm, and then an organic EL device forming cell having openings corresponding to light emitting regions of 2 mm by 2 mm were formed on the anode 5 by evaporation.

A 50 nm thick hole transport light emitting layer 4b of α-NPD (α-naphthylphenyldiamine) having a structural formula shown in FIG. 17 was formed on the anode 5 by evaporation at a deposition rate in the range of 0.2 to 0.4 nm/sec to construct a single-layer hole transport layer 4. A layer of α-TPD shown in FIG. 18B or TPD shown in FIG. 18C may be used instead of the layer of α-NPD.

A 20 nm thick exciton generation promoting layer 33 was formed by depositing bathocuproin (2,9-dimethyl-4,7-diphenyl-1,10-phenanthroline) having a structural formula 2 shown in FIG. 4 on the hole transport light emitting layer 4b by evaporation at a deposition rate in the range of 0.2 to 0.4 nm/sec.

A 30 nm thick electron transport layer 2 was formed on the exciton generation promoting layer 33 by depositing Alq$_3$ (8-hydroxyquinoline aluminum) having a structural formula shown in FIG. 19 by evaporation. Finally, an about 200 nm thick cathode 1 was formed by depositing an aluminum-lithium alloy (about 1 mol % Li concentration) by evaporation to complete the organic EL device 22 shown in FIG. 20. The characteristics of the organic EL device 22 were measured.

Figure 25:
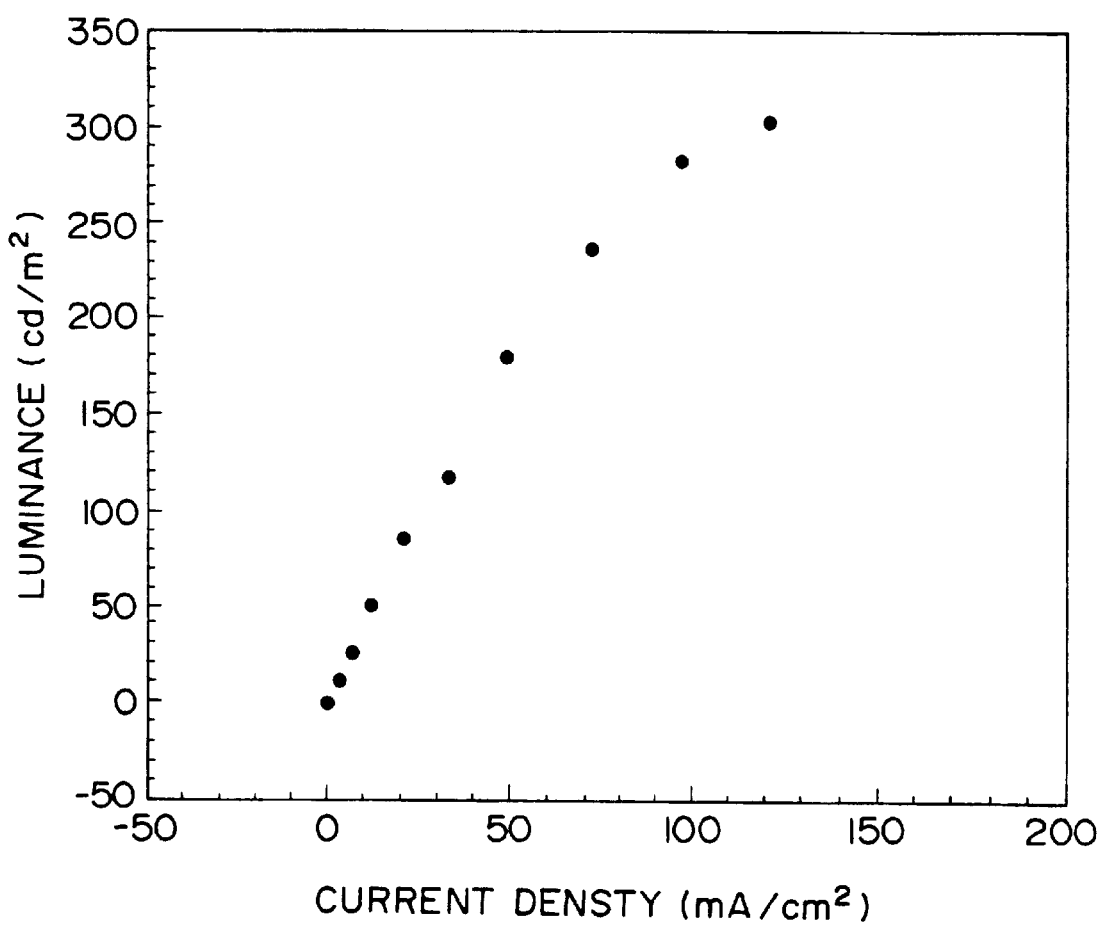
FIG. 25 is a graph showing the current-luminance characteristics of the organic EL device in the second embodiment.

FIG. 24 is a graph showing the spectral characteristics of the organic EL device 22. A maximum emission wavelength corresponding to a peak absorbance is about 460 nm. The coordinates of light emitted by the organic EL device 22 on a CIE chromaticity coordinate system are (0.155, 0.11), which indicates that the light is satisfactory blue light. As shown in FIG. 25, the luminance was 1,400 cd/m$^2$ when current density was 400 mA/cm$^2$. It was obvious from the shape of the emission spectrum that the light was emitted by the hole transport light emitting layer 4b of α-NPD. As is obvious from a threshold voltage characteristic shown in FIG. 26, current flows scarcely while voltage is below about 5 V, current increases gradually after the voltage has increased beyond 5 V, and current increases sharply after the voltage has increased beyond 6 V. Thus, the organic EL device 22 can be driven by power of a low voltage and has satisfactory threshold voltage characteristic.

[Third Embodiment]

The organic EL device 23 in the third embodiment according to the present invention will be described in terms of a method of fabricating the same.

An about 100 nm thick transparent anode 5 of ITO was formed on a glass substrate 6 of 30 mm by 30 mm, and then an organic EL device forming cell having openings corresponding to light emitting regions of 2 mm by 2 mm were formed on the anode 5 by evaporation.

A 50 nm thick hole transport light emitting layer 4a of m-MTDATA (4,4',4"-tris (3-methuylphenylamino) triphenylamine having a structural formula shown in FIG. 16 was formed on the anode 5 by evaporation at a deposition rate in the range of 0.2 to 0.4 nm/sec. The third embodiment, similarly to the second embodiment, is provided with a single-layer hole transport light emitting layer.

A 20 nm thick exciton generation promoting layer 33 was formed by depositing bathocuproin (2,9-dimethyl-4,7-diphenyl-1,10-phenanthroline) having a structural formula 2 shown in FIG. 4 on the hole transport light emitting layer 4a by evaporation at a deposition rate in the range of 0.2 to 0.4 nm/sec.

A 30 nm thick electron transport layer 2 was formed on the exciton generation promoting layer 33 by depositing Alq$_3$ (8-hydroxyquinoline aluminum) having a structural formula shown in FIG. 19 by evaporation. Finally, an about 200 nm thick cathode 1 was formed by depositing an aluminum-lithium alloy (about 1 mol % Li concentration) by evaporation to complete the organic EL device 23 shown in FIG. 21. The characteristics of the organic EL device 22 were measured.

Figure 27:
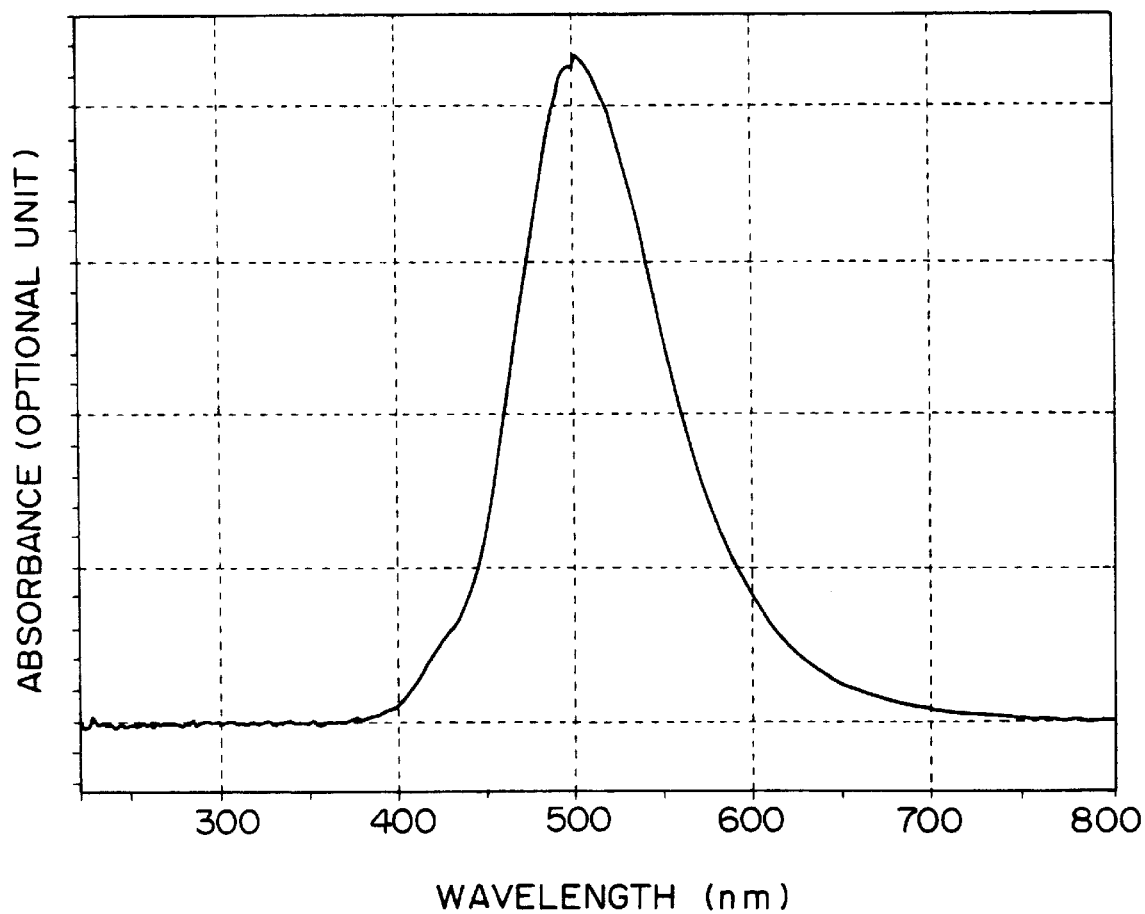
FIG. 27 is a graph showing the spectral characteristic of the organic EL device in the third embodiment.
Figure 28:
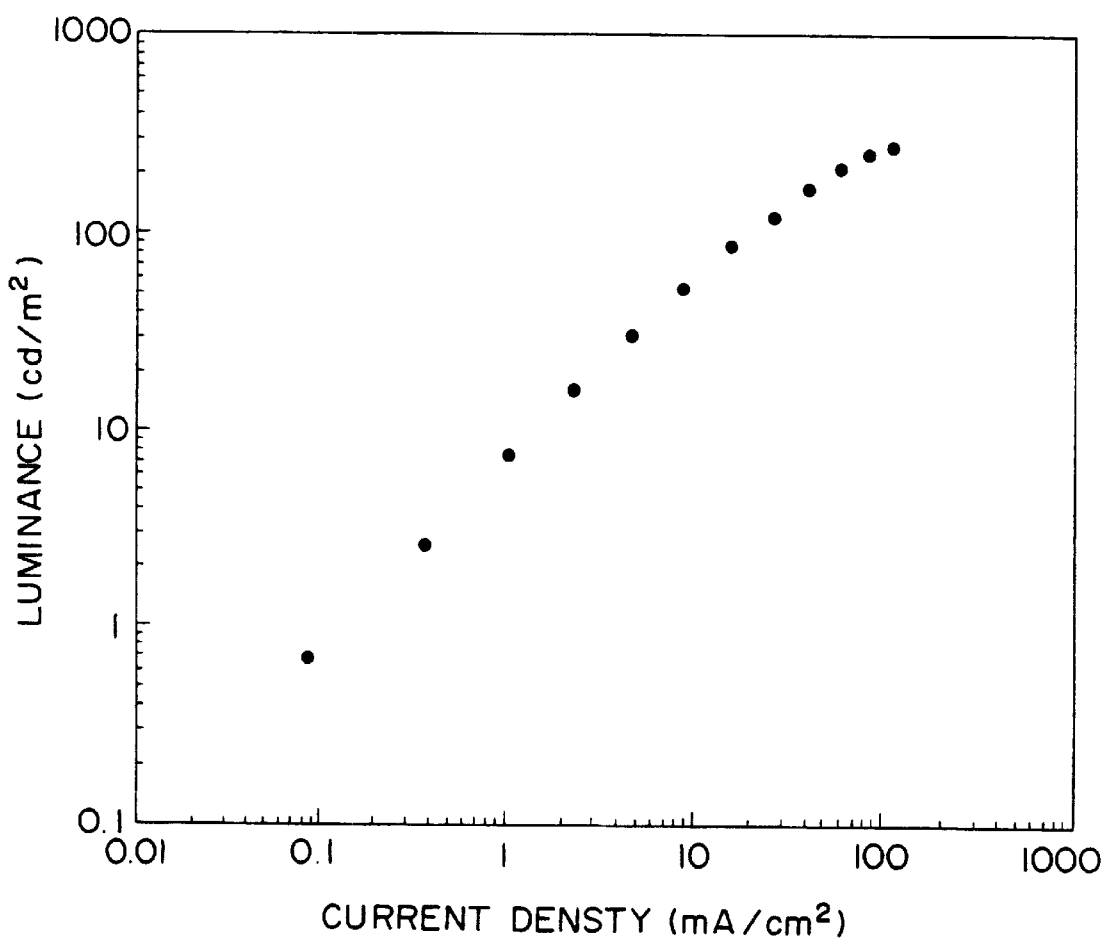
FIG. 28 is a graph showing the current-luminance characteristic of the organic EL device in the third embodiment.
Figure 29:
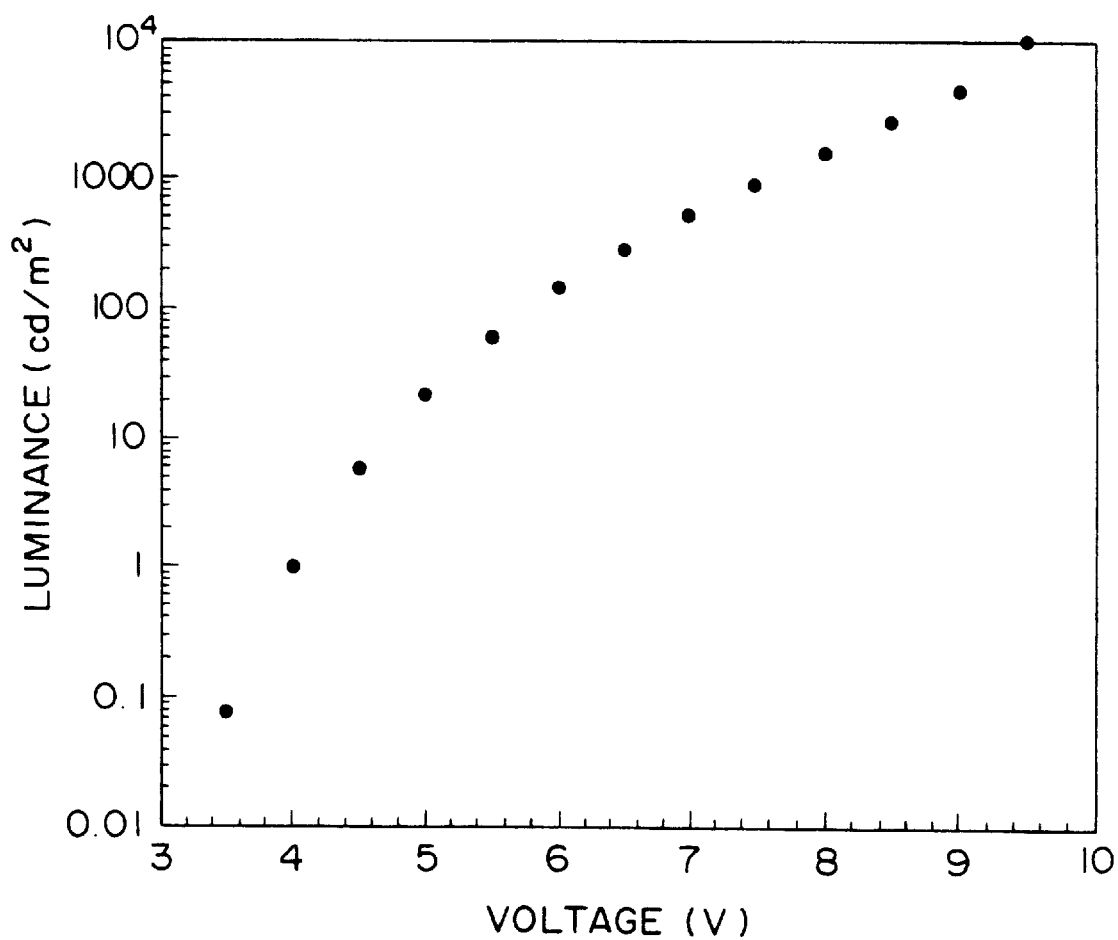
FIG. 29 is a graph showing the voltage-luminance characteristic of the organic EL device in the third embodiment.
Figure 33:
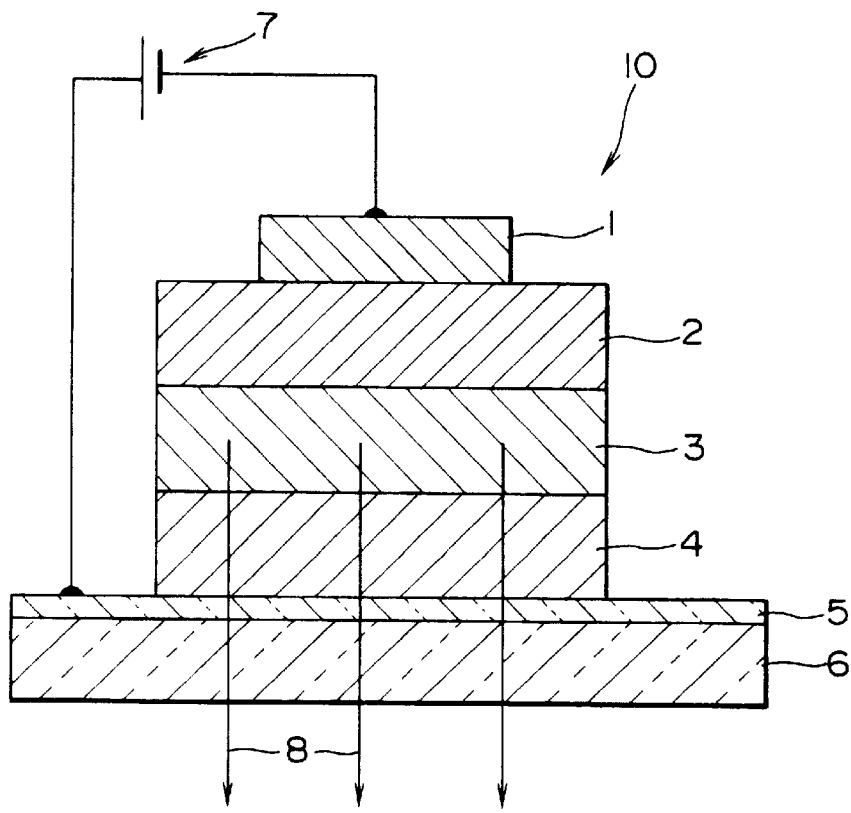
FIG. 33 is a cross-sectional view of a conventional organic EL device in accordance with the prior art.
Figure 34:
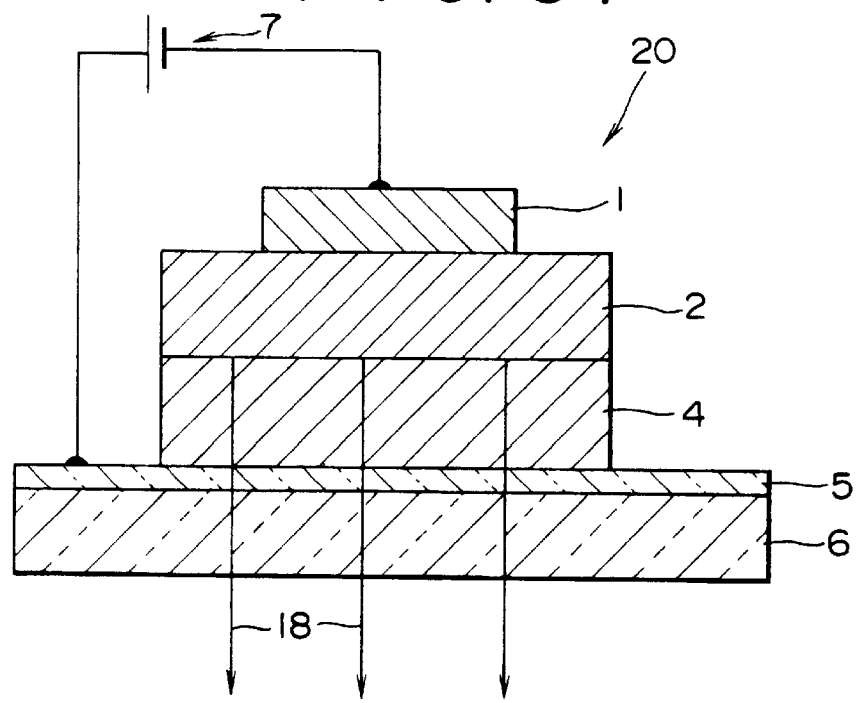
FIG. 34 is a cross-sectional view of another conventional organic EL device in accordance with the prior art.
Figure 35:
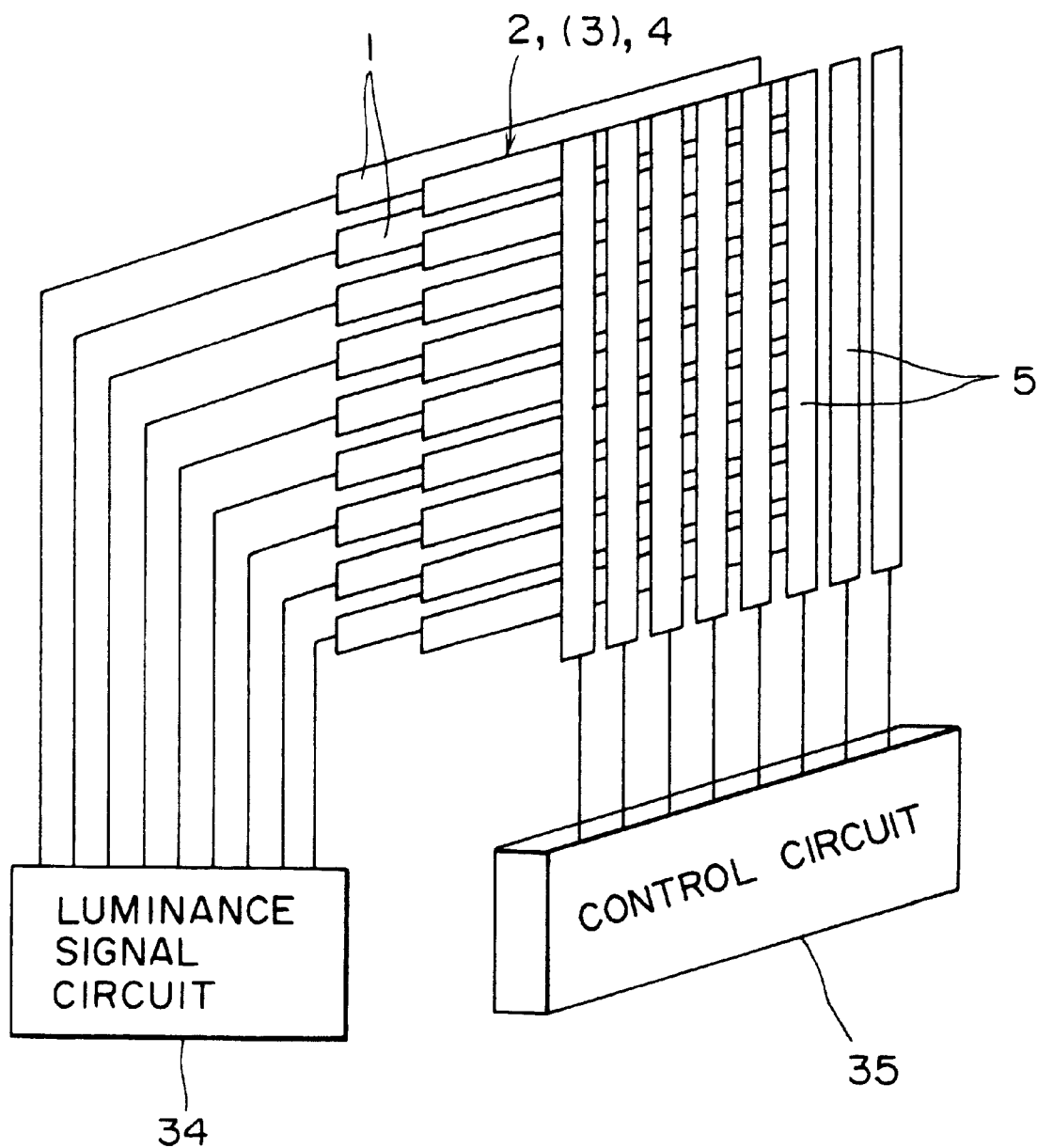
FIG. 35 is a schematic perspective view of the organic EL device of FIG. 34.

FIG. 27 is a graph showing the spectral characteristics of the organic EL device 23 in the third embodiment shown in FIG. 21. A maximum emission wavelength corresponding to a peak absorbance is about 500 nm. The coordinates of light emitted by the organic EL device 23 on a CIE chromaticity coordinate system are (0.26, 0.47), which indicates that the light is satisfactory green light. As shown in FIG. 28, luminance was 280 cd/m$^2$ when current density was 110 mA/cm$^2$. It was obvious from the shape of the emission spectrum that the light was emitted by the hole transport light emitting layer 4a of m-MTDATA. It is known from a voltage-luminance characteristic shown in FIG. 29 that the organic EL device 23 can be driven by power of a low voltage and the luminance is satisfactory.

As is apparent from the foregoing description, the organic EL device in the first to the third embodiment according to the present invention are provided with the exciton generation promoting layer 33 sandwiched between the hole transport light emitting layer 4a and/or the hole transport light emitting layer 4b, and the electron transport layer 2. Therefore, sufficient excitons are generated in the hole transport layer 4 and the hole transport layer 4 serves also as a light emitting layer, so that light can be emitted stably at a high efficiency.

Organic EL devices which emit blue light like those in the first and the second embodiment, organic EL devices which emit green light like that in the third embodiment can be fabricated, organic EL devices which emit red light can be fabricated by properly doping the light emitting layer, and the chromaticity can be adjusted by proper doping.

The foregoing embodiments proved that an organic EL device capable of emitting blue light of excellent chromaticity in a high luminance can be fabricated by using existing materials. Thus, the present invention reduces time necessary for material development and provides guidelines on the design of new luminescent materials and electron transport materials.

[Fourth Embodiment]

The organic EL device 21A in the fourth embodiment has a layered structure similar to that of the organic EL device 21 the first embodiment is similar to the organic EL device 21 in the first embodiment. The organic EL device 21A is provided with a layer for the efficient injection of holes from the anode 5.

The organic EL device 21A in the fourth embodiment according to the present invention will be described in terms of a method of fabricating the same.

As shown in FIG. 1, an about 100 nm thick transparent anode 5 of ITO was formed on a glass substrate 6 of 30 mm by 30 mm, and then an organic EL device forming cell of SiO$_2$ having openings corresponding to light emitting regions of 2 mm by 2 mm were formed on the anode 5 by evaporation.

A 100 nm thick hole injection layer 7 of m-MTDATA (4,4',4'-tris (3-methylphenylamino) triphenylamine having a structural formula shown in FIG. 16) was formed on the anode 5 by vacuum evaporation at a deposition rate in the range of 0.2 to 0.4 nm/sec.

A 30 nm thick hole transport light emitting layer 4b of α-NPD (α-naphthylphenyldiamine) having a structural formula shown in FIG. 17 was formed on the hole injection layer 7 by vacuum evaporation at a deposition rate in the range of 0.2 to 0.4 nm/sec to construct a hole transport layer 4.

A 20 nm thick exciton generation promoting layer 33 of bathocuproin (2,9-dimethyl-4,7-diphenyl-1,10-phenanthroline) having a structural formula 2 shown in FIG. 4 was formed on the hole transport light emitting layer 4b by evaporation at a deposition rate in the range of 0.2 to 0.4 nm/sec.

A 30 nm thick electron transport layer 2 was formed on the exciton generation promoting layer 33 by depositing Alq$_3$ (8-hydroxyquinoline aluminum) having a structural formula shown in FIG. 19 by evaporation, an about 10 nm thick cathode 1 was formed by depositing an aluminum-lithium alloy (about 1 mol % Li concentration) by evaporation. A two-layer sealing film consisting of a 200 nm Al film and a 200 nm thick Au film was formed by evaporation on the cathode 1 to complete the organic EL device 21A shown in FIG. 1. The characteristics of the organic EL device 21A were measured.

FIG. 30 is a graph showing the spectral characteristics of the organic EL device 21A. A maximum emission wavelength corresponding to a peak absorbance is 460 nm. The coordinates of light emitted by the organic EL device 21A on a CIE chromaticity coordinate system are (0.165, 0.160), which indicates that the light is satisfactory blue light. Thus, it is obvious that the transportation of holes is controlled by the exciton generation promoting layer 33 and excitons are generated efficiently in the hole transport light emitting layer 4b. The luminance was 1500 cd/m$^2$ when current density was 200 mA/cm$^2$. Luminous efficiency was 1.21 m/W when current density was 1 mA/cm2. It was obvious from the shape of the emission spectrum that the light was emitted by α-NPD.

The organic EL device 21A was driven in a constant-current drive mode in an environment of 20° C. and 30% RH. Voltage rise was not experienced one hour after the start of driving. Drive voltage decreased by half in 10 min after the start of driving. The value of driving voltage one hour after the start of driving was in the range of 60% to 70% of the value of the same immediately after the start of driving.

Organic EL devices similar to the organic EL device 21A and not provided with the hole injection layer 7 were fabricated as comparative examples. When the organic EL devices in comparative examples were driven in a constant-current drive mode in an environment of 20° C. and 30% RH, the value of driving voltage started increasing immediately after the start of driving and most comparative samples stopped light emission in one hour after the start of driving. It is obvious from the foregoing results that the hole injection layer is effective in assuring the stability of the organic EL device and extending the life of the organic EL device.

[Fifth Embodiment]

An organic EL device 21B in a fifth embodiment according to the present invention will be described in terms of a method of fabricating the same.

As shown in FIG. 1, an about 100 nm thick transparent anode 5 of ITO was formed on a glass substrate 6 of 30 mm by 30 mm, and then an organic EL device forming cell of $SiO_2$ having openings corresponding to light emitting regions of 2 mm by 2 mm were formed on the anode 5 by evaporation.

A 150 nm thick hole injection layer 7 of m-MTDATA (4,4',4"-tris (3-methylphenylamino) triphenylamine having a structural formula shown in FIG. 16 was formed on the anode 5 by vacuum evaporation at a deposition rate in the range of 0.2 to 0.4 nm/sec.

A 30 nm thick hole transport light emitting layer 4b of α-NPD (α-naphthylphenyldiamine) having a structural formula shown in FIG. 17 was formed on the hole injection layer 7 by vacuum evaporation at a deposition rate in the range of 0.2 to 0.4 nm/sec to construct a hole transport layer 4.

A 20 nm thick exciton generation promoting layer 33 of bathocuproin (2,9-dimethyl-4,7-diphenyl-1,10-phenanthroline) having a structural formula 2 shown in FIG. 4 was formed on the hole transport light emitting layer 4b by evaporation at a deposition rate in the range of 0.2 to 0.4 nm/sec.

A 30 nm thick electron transport layer 2 was formed on the exciton generation promoting layer 33 by depositing $Alq_3$ (8-hydroxyquinoline aluminum) having a structural formula shown in FIG. 19 by evaporation, an about 10 nm thick cathode 1 was formed by depositing an aluminum-lithium alloy (about 1 mol % Li concentration) by evaporation. A two-layer sealing film consisting of a 200 nm Al film and a 200 nm thick Au film was formed by evaporation on the cathode 1 to complete the organic EL device 21B shown in FIG. 1.

The spectral characteristics of the organic EL device 21B were measured. Light emitted by the organic EL device 21B, similarly to the light emitted by the organic EL device 21A in the fourth embodiment, had a maximum emission wavelength of 460 nm corresponding to a peak absorbance. The coordinates of light emitted by the organic EL device 21B on a CIE chromaticity coordinate system were (0.160, 0.170), which indicated that the light was satisfactory blue light. The luminance was 1480 cd/m$^2$ when current density was 200 mA/cm$^2$. It was obvious from the shape of the emission spectrum that the light was emitted by α-NPD.

The organic EL device 21B was driven in a constant-current drive mode in an environment of 20° C. and 30% RH. Voltage rise was not experienced one hour after the start of driving. Drive voltage decreased by half in 10 min after the start of driving. The value of driving voltage one hour after the start of driving was in the range of 60% to 70% of the value of the same immediately after the start of driving.

Organic EL devices similar to the organic EL device 21B and not provided with the hole injection layer 7 were fabricated as comparative examples. When the organic EL devices in comparative examples were driven in a constant-current drive mode in an environment of 20° C. and 30% RH, most comparative samples stopped light emission in one hour after the start of driving. It is obvious from the foregoing results that the hole injection layer is effective in assuring the stability of the organic EL device and extending the life of the organic EL device.

[Sixth Embodiment]

An organic EL device 21C in a sixth embodiment according to the present invention will be described in terms of a method of fabricating the same.

As shown in FIG. 1, an about 100 nm thick transparent anode 5 of ITO was formed on a glass substrate 6 of 30 mm by 30 mm, and then an organic EL device forming cell of $SiO_2$ having openings corresponding to light emitting regions of 2 mm by 2 mm were formed on the anode 5 by evaporation.

A 100 nm thick hole injection layer 7 of m-MTDATA (4,4',4"-tris (3-methylphenylamino) triphenylamine having a structural formula shown in FIG. 16) was formed on the anode 5 by vacuum evaporation at a deposition rate in the range of 0.2 to 0.4 nm/sec.

A 50 nm thick hole transport light emitting layer 4b of α-NPD (α-naphthylphenyldiamine) having a structural formula shown in FIG. 17 was formed on the hole injection layer 7 by vacuum evaporation at a deposition rate in the range of 0.2 to 0.4 nm/sec to construct a hole transport layer 4.

A 20 nm thick exciton generation promoting layer 33 of bathocuproin (2,9-dimethyl-4,7-diphenyl-1,10-phenanthroline) having a structural formula 2 shown in FIG. 4 was formed on the hole transport light emitting layer 4b by evaporation at a deposition rate in the range of 0.2 to 0.4 nm/sec.

A 30 nm thick electron transport layer 2 was formed on the exciton generation promoting layer 33 by depositing $Alq_3$ (8-hydroxyquinoline aluminum) having a structural formula shown in FIG. 19 by evaporation, an about 10 nm thick cathode 1 was formed by depositing an aluminum-lithium alloy (about 1 mol % Li concentration) by evaporation. A two-layer sealing film consisting of a 200 nm Al film and a 200 nm thick Au film was formed by evaporation on the cathode 1 to complete the organic EL device 21C shown in FIG. 1.

The spectral characteristics of the organic EL device 21C were measured. Light emitted by the organic EL device 21C, similarly to the light emitted by the organic EL device 21A in the fourth embodiment, had a maximum emission wavelength of 460 nm corresponding to a peak absorbance. The coordinates of light emitted by the organic EL device 21B on a CIE chromaticity coordinate system are (0.160, 0.140), which indicates that the light is satisfactory blue light. The luminance was 1500 cd/m$^2$ when current density was 200 mA/cm$^2$. It was obvious from the shape of the emission spectrum that the light was emitted by α-NPD.

The organic EL device 21C was driven in a constant-current drive mode in an environment of 20° C. and 30%

RH. Voltage rise was not experienced one hour after the start of driving. Drive voltage decreased by half in 10 min after the start of driving. The value of driving voltage one hour after the start of driving was in the range of 60% to 70% of the value of the same immediately after the start of driving. organic EL devices similar to the organic EL device 21C and not provided with the hole injection layer 7 were fabricated as comparative examples. When the organic EL devices in comparative examples were driven in a constant-current drive mode in an environment of 20° C. and 30% RH, most comparative samples stopped light emission in one hour after the start of driving. It is obvious from the foregoing results that the hole injection layer is effective in assuring the stability of the organic EL device and extending the life of the organic EL device.

[Seventh Embodiment]

An organic EL device 21D in a seventh embodiment according to the present invention will be described in terms of a method of fabricating the same.

As shown in FIG. 1, an about 100 nm thick transparent anode 5 of ITO was formed on a glass substrate 6 of 30 mm by 30 mm, and then an organic EL device forming cell of $SiO_2$ having openings corresponding to light emitting regions of 2 mm by 2 mm were formed on the anode 5 by evaporation.

A 200 nm thick hole injection layer 7 of m-MTDATA (4,4',4"-tris (3-methylphenylamino) triphenylamine having a structural formula shown in FIG. 16) was formed on the anode 5 by vacuum evaporation at a deposition rate in the range of 0.2 to 0.4 nm/sec.

A 50 nm thick hole transport light emitting layer 4b of α-NPD (α-naphthylphenyldiamine) having a structural formula shown in FIG. 17 was formed on the hole injection layer 7 by vacuum evaporation at a deposition rate in the range of 0.2 to 0.4 nm/sec to construct a hole transport layer 4.

A 20 nm thick exciton generation promoting layer 33 of bathocuproin (2,9-dimethyl-4,7-diphenyl-1,10-phenanthroline) having a structural formula 2 shown in FIG. 4 was formed on the hole transport light emitting layer 4b by evaporation at a deposition rate in the range of 0.2 to 0.4 nm/sec.

A 30 nm thick electron transport layer 2 was formed on the exciton generation promoting layer 33 by depositing $Alq_3$ (8-hydroxyquinoline aluminum) having a structural formula shown in FIG. 19 by evaporation, an about 10 nm thick cathode 1 was formed by depositing an aluminum-lithium alloy (about 1 mol % Li concentration) by evaporation. A two-layer sealing film consisting of a 200 nm Al film and a 200 nm thick Au film was formed by evaporation on the cathode 1 to complete the organic EL device 21D shown in FIG. 1.

The spectral characteristics of the organic EL device 21D were measured. Light emitted by the organic EL device 21D, similarly to the light emitted by the organic EL device 21A in the fourth embodiment, had a maximum emission wavelength of 460 nm corresponding to a peak absorbance. The coordinates of light emitted by the organic EL device 21B on a CIE chromaticity coordinate system were (0.160, 0.190), which indicated that the light was satisfactory blue light. The luminance was 1000 cd/m$^2$ when current density was 150 mA/cm$^2$. It was obvious from the shape of the emission spectrum that the light was emitted by α-NPD.

The organic EL device 21D was driven in a constant-current drive mode in an environment of 20° C. and 30% RH. Voltage rise was not experienced one hour after the start of driving. Drive voltage decreased by half in 10 min after the start of driving. The value of driving voltage one hour after the start of driving was in the range of 60% to 70% of the value of the same immediately after the start of driving.

Organic EL devices similar to the organic EL device 21C and not provided with the hole injection layer 7 were fabricated as comparative examples. When the organic EL devices in comparative examples were driven in a constant-current drive mode in an environment of 20° C. and 30% RH, driving voltage started increasing immediately after the start of driving and most comparative samples stopped light emission in one hour after the start of driving. It is obvious from the foregoing results that the hole injection layer is effective in assuring the stability of the organic EL device and extending the life of the organic EL device.

[Eighth Embodiment]

An organic EL device 21E in an eighth embodiment according to the present invention will be described in terms of a method of fabricating the same.

As shown in FIG. 1, an about 100 nm thick transparent anode 5 of ITO was formed on a glass substrate 6 of 30 mm by 30 mm, and then an organic EL device forming cell of $SiO_2$ having openings corresponding to light emitting regions of 2 mm by 2 mm were formed on the anode 5 by evaporation.

A 250 nm thick hole injection layer 7 of m-MTDATA (4,4',4"-tris (3-methuylphenylamino) triphnylamine having a structural formula shown in FIG. 16 was formed on the anode 5 by vacuum evaporation at a deposition rate in the range of 0.2 to 0.4 nm/sec.

A 50 nm thick hole transport light emitting layer 4b of α-NPD (α-naphthylphenyldiamine) having a structural formula shown in FIG. 17 was formed on the hole injection layer 7 by vacuum evaporation at a deposition rate in the range of 0.2 to 0.4 nm/sec to construct a hole transport layer 4.

A 20 nm thick exciton generation promoting layer 33 of bathocuproin (2,9-dimethyl-4,7-diphenyl-1,10-phenanthroline) having a structural formula 2 shown in FIG. 4 was formed on the hole transport light emitting layer 4b by evaporation at a deposition rate in the range of 0.2 to 0.4 nm/sec.

A 30 nm thick electron transport layer 2 was formed on the exciton generation promoting layer 33 by depositing $Alq_3$ (8-hydroxyquinoline aluminum) having a structural formula shown in FIG. 19 by evaporation, an about 10 nm thick cathode 1 was formed by depositing an aluminum-lithium alloy (about 1 mol % Li concentration) by evaporation. A two-layer sealing film consisting of a 200 nm Al film and a 200 nm thick Au film was formed by evaporation on the cathode 1 to complete the organic EL device 21E shown in FIG. 1.

The spectral characteristics of the organic EL device 21E were measured. Light emitted by the organic EL device 21E, similarly to that emitted by the organic EL device 21A in the fourth embodiment, had a maximum emission wavelength of 460 nm corresponding to a peak absorbance and had coordinates of (0.163, 0.200) on a CIE chromaticity coordinate system. The light was satisfactory blue light. The luminance was 900 cd/m$^2$ when current density was 150 mA/cm$^2$. It was obvious from the shape of the emission spectrum that the light was emitted by α-NPD.

The organic EL device 21E was driven in a constant-current drive mode in an environment of 20° C. and 30% RH. Voltage rise was not experienced one hour after the start of driving. Value of drive voltage decreased to about 70% of the value of drive voltage immediately after the start of driving in 10 min after the start of driving. The value of driving voltage one hour after the start of driving was in the range of 70% to 80% of the value of the same immediately after the start of driving.

Organic EL devices similar to the organic EL device 21E and not provided with the hole injection layer 7 were fabricated as comparative examples. When the organic EL devices in comparative examples were driven in a constant-current drive mode in an environment of 20° C. and 30% RH, most comparative samples stopped light emission in one hour after the start of driving. It is obvious from the foregoing results that the hole injection layer is effective in assuring the stability of the organic EL device and extending the life of the organic EL device.

[Ninth Embodiment]

An organic EL device 21F in a ninth embodiment according to the present invention will be described in terms of a method of fabricating the same.

As shown in FIG. 1, an about 100 nm thick transparent anode 5 of ITO was formed on a glass substrate 6 of 30 mm by 30 mm, and then an organic EL device forming cell of $SiO_2$ having openings corresponding to light emitting regions of 2 mm by 2 mm were formed on the anode 5 by evaporation.

A 300 nm thick hole injection layer 7 of m-MTDATA (4,4',4''-tris (3-methylphenylamino) triphenylamine having a structural formula shown in FIG. 16 was formed on the anode 5 by vacuum evaporation at a deposition rate in the range of 0.2 to 0.4 nm/sec.

A 30 nm thick hole transport light emitting layer 4b of α-NPD (α-naphthylphenyldiamine) having a structural formula shown in FIG. 17 was formed on the hole injection layer 7 by vacuum evaporation at a deposition rate in the range of 0.2 to 0.4 nm/sec to construct a hole transport layer 4.

A 20 nm thick exciton generation promoting layer 33 of bathocuproin (2,9-dimethyl-4,7-diphenyl-1,10-phenanthroline) having a structural formula 2 shown in FIG. 4 was formed on the hole transport light emitting layer 4b by evaporation at a deposition rate in the range of 0.2 to 0.4 nm/sec.

A 30 nm thick electron transport layer 2 was formed on the exciton generation promoting layer 33 by depositing $Alq_3$ (8-hydroxyquinoline aluminum) having a structural formula shown in FIG. 19 by evaporation, an about 10 nm thick cathode 1 was formed by depositing an aluminum-lithium alloy (about 1 mol % Li concentration) by evaporation. A two-layer sealing film consisting of a 200 nm Al film and a 200 nm thick Au film was formed by evaporation on the cathode 1 to complete the organic EL device 21F shown in FIG. 1.

The spectral characteristics of the organic EL device 21F were measured. As is obvious from a spectral characteristics graph shown in FIG. 31, light emitted by the organic EL device 21F has a wide maximum emission wavelength range of 460 to 500 nm. It is obvious from the shape of the emission spectrum that the light is emitted by α-NPD and m-MTDATA. The graph of FIG. 31 signifies that an exciton generating region shifted from the α-NPD layer, i.e., the hole transport light emission layer 4b, near to the m-MTDATA layer, i.e., the hole injection layer 7. Although blue light could be emitted by forming the hole injection layer 7 in a thickness of 300 nm, the chromaticity of the light was not satisfactory, and light emitting efficiency tended to decrease. Therefore, it is preferable that the thickness of the hole injection layer 7 is 300 nm or below.

[Tenth Embodiment]

An organic EL device 21G in a tenth embodiment according to the present invention will be described in terms of a method of fabricating the same.

As shown in FIG. 1, an about 100 nm thick transparent anode 5 of ITO was formed on a glass substrate 6 of 30 mm by 30 mm, and then an organic EL device forming cell of $SiO_2$ having openings corresponding to light emitting regions of 2 mm by 2 mm were formed on the anode 5 by evaporation.

A 100 nm thick hole injection layer 7 of α-NPD (α-naphtylmethyldiamine) having a structural formula shown in FIG. 17 was formed on the anode 5 by vacuum evaporation at a deposition rate in the range of 0.2 to 0.4 nm/sec.

A 50 nm thick hole transport light emitting layer 4b of TPD (N,N-diphenyl-N,N'-bis(3-methylphenyl)-1,1'-biphenyl-4,4'-diamine) having a structural formula shown in FIG. 18C was formed on the hole injection layer 7 by vacuum evaporation at a deposition rate in the range of 0.2 to 0.4 nm/sec to construct a hole transport layer 4.

A 20 nm thick exciton generation promoting layer 33 of bathocuproin (2,9-dimethyl-4,7-diphenyl-1,10-phenanthroline) having a structural formula 2 shown in FIG. 4 was formed on the hole transport light emitting layer 4b by evaporation at a deposition rate in the range of 0.2 to 0.4 nm/sec.

A 30 nm thick electron transport layer 2 was formed on the exciton generation promoting layer 33 by depositing $Alq_3$ (8-hydroxyquinoline aluminum) having a structural formula shown in FIG. 19 by evaporation, an about 10 nm thick cathode 1 was formed by depositing an aluminum-lithium alloy (about 1 mol % Li concentration) by evaporation. A two-layer sealing film consisting of a 200 nm Al film and a 200 nm thick Au film was formed by evaporation on the cathode 1 to complete the organic EL device 21G shown in FIG. 1.

The spectral characteristics of the organic EL device 21F were measured. Light emitted by the organic EL device 21F had a maximum emission wavelength of 460 nm corresponding to a peak absorbance and was blue light. The luminance was 110 $cd/m^2$ when current density was 50 $mA/cm^2$. It was obvious from the shape of the emission spectrum that the light was emitted by TPD.

The organic EL device 21G was driven in a constant-current drive mode in an environment of 20° C. and 30% RH. Voltage rise was not experienced one hour after the start of driving. Value of drive voltage decreased to about 70% of the value of drive voltage immediately after the start of driving in 10 min after the start of driving. The value of driving voltage one hour after the start of driving was in the range of 80% to 90% of the value of the same immediately after the start of driving.

Organic EL devices similar to the organic EL device 21E and not provided with the hole injection layer 7 were fabricated as comparative examples. When the organic EL devices in comparative examples were driven in a constant-current drive mode in an environment of 20° C. and 30% RH, most comparative samples stopped light emission in 30 min after the start of driving. It is obvious from the foregoing results that the hole injection layer is effective in assuring the stability of the organic EL device and extending the life of the organic EL device.

[Eleventh Embodiment]

An organic EL device 21H in an eighth embodiment according to the present invention will be described in terms of a method of fabricating the same.

As shown in FIG. 1, an about 100 nm thick transparent anode 5 of ITO was formed on a glass substrate 6 of 30 mm by 30 mm, and then an organic EL device forming cell of $SiO_2$ having openings corresponding to light emitting regions of 2 mm by 2 mm were formed on the anode 5 by evaporation.

A 50 nm thick hole injection layer 7 of m-MTDATA (4,4',4"-tris (3-methylphenylamino) triphenylamine having a structural formula shown in FIG. 16) was formed on the anode 5 by vacuum evaporation at a deposition rate in the range of 0.2 to 0.4 nm/sec.

A 50 nm thick hole transport light emitting layer 4b of α-NPD (α-naphthylphenyldiamine) having a structural formula shown in FIG. 17 was formed on the hole injection layer 7 by vacuum evaporation at a deposition rate in the range of 0.2 to 0.4 nm/sec to construct a hole transport layer 4.

A 20 nm thick exciton generation promoting layer 33 of bathocuphenanthroline (4,7-biphenyl-1,10-phenanthroline) having a structural formula 1 shown in FIG. 3 was formed on the hole transport light emitting layer 4b by evaporation at a deposition rate in the range of 0.2 to 0.4 nm/sec.

A 30 nm thick electron transport layer 2 was formed on the exciton generation promoting layer 33 by depositing Alq₃ (8-hydroxyquinoline aluminum) having a structural formula shown in FIG. 19 by evaporation, an about 10 nm thick cathode 1 was formed by depositing an aluminum-lithium alloy (about 1 mol % Li concentration) by evaporation. A two-layer sealing film consisting of a 200 nm Al film and a 200 nm thick Au film was formed by evaporation on the cathode 1 to complete the organic EL device 21H shown in FIG. 1.

The spectral characteristics of the organic EL device 21H were measured. Light emitted by the organic EL device 21H had a maximum emission wavelength of 460 nm corresponding to a peak absorbance and had coordinates of (0.16, 0.19) on a CIE chromaticity coordinate system. The light was satisfactory blue light. The luminance was 800 cd/m² when current density was 250 mA/cm². It was obvious from the shape of the emission spectrum that the light was emitted by α-NPD, which was the same as the organic EL device provided with the exciton generation promoting layer 33 of bathocuproin.

The organic EL device 21E was driven in a constant-current drive mode in an environment of 20 C and 30% RH. There was a voltage rise in the range of 0.1 to 0.3 V in one hour after the start of driving, which was small as compared with that in organic EL devices similar to the organic EL device 21H and not provided with the hole injection layer 7. When the organic EL devices not provided with the hole injection layer 7 were driven in an environment of 20° C. and 30% RH, drive voltage started immediately after the start of driving and most comparative samples stopped light emission in one hour after the start of driving. It is obvious from FIG. 32 showing the voltage-current characteristic of the organic EL device 21H in the eleventh embodiment that the organic EL device 21H can be driven by driving power of a low voltage. It is obvious from the foregoing results that the hole injection layer is effective in assuring the stability of the organic EL device and extending the life of the organic EL device.

[Twelfth Embodiment]

An organic EL device 21I in a twelfth embodiment according to the present invention will be described in terms of a method of fabricating the same.

As shown in FIG. 1, an about 100 nm thick transparent anode 5 of ITO was formed on a glass substrate 6 of 30 mm by 30 mm, and then an organic EL device forming cell of SiO₂ having openings corresponding to light emitting regions of 2 mm by 2 mm were formed on the anode 5 by evaporation.

A 150 nm thick hole injection layer 7 of M-MTDATA (4,4',4"-tris (3-methylphenylamino) triphenylamine having a structural formula shown in FIG. 16) was formed on the anode 5 by vacuum evaporation at a deposition rate in the range of 0.2 to 0.4 nm/sec.

A 50 nm thick hole transport light emitting layer 4b of α-NPD (α-naphthylphenyldiamine) having a structural formula shown in FIG. 17 was formed on the hole injection layer 7 by vacuum evaporation at a deposition rate in the range of 0.2 to 0.4 nm/sec to construct a hole transport layer 4.

A 20 nm thick exciton generation promoting layer 33 of bathocuphenanthroline (4,7-biphenyl-1,10-phenanthroline) having a structural formula 1 shown in FIG. 3 was formed on the hole transport light emitting layer 4b by evaporation at a deposition rate in the range of 0.2 to 0.4 nm/sec.

A 30 nm thick electron transport layer 2 was formed on the exciton generation promoting layer 33 by depositing Alq₃ (8-hydroxyquinoline aluminum) having a structural formula shown in FIG. 19 by evaporation, an about 10 nm thick cathode 1 was formed by depositing an aluminum-lithium alloy (about 1 mol % Li concentration) by evaporation. A two-layer sealing film consisting of a 200 nm Al film and a 200 nm thick Au film was formed by evaporation on the cathode 1 to complete the organic EL device 21I shown in FIG. 1.

The spectral characteristics of the organic EL device 21I were measured. Light emitted by the organic EL device 21I had a maximum emission wavelength of 460 nm corresponding to a peak absorbance and had coordinates of (0.18, 0.20) on a CIE chromaticity coordinate system. The light emitted by the organic EL device 21I was blue light The luminance was 750 cd/m2 when current density was 240 mA/cm2. It was obvious from the shape of the emission spectrum that the light was emitted by α-NPD, which was the same as the organic EL device provided with the exciton generation promoting layer 33 of bathocuproin.

The organic EL device 21I was driven in a constant-current drive mode in an environment of 20° C. and 30% RH. There was a voltage rise in the range of 0.1 to 0.2 V in one hour after the start of driving, which was small as compared with that in organic EL devices similar to the organic EL device 21H and not provided with the hole injection layer 7. When the organic EL devices not provided with the hole injection layer 7 were driven in an environment of 20° C. and 30% RH, drive voltage started increasing immediately after the start of driving and most comparative samples stopped light emission in one hour after the start of driving. It is obvious from the foregoing results that the hole injection layer is effective in assuring the stability of the organic EL device and extending the life of the organic EL device.

[Thirteenth Embodiment]

An organic EL device 21J in a thirteenth embodiment according to the present invention will be described in terms of a method of fabricating the same.

As shown in FIG. 1, an about 100 nm thick transparent anode 5 of ITO was formed on a glass substrate 6 of 30 mm by 30 mm, and then an organic EL device forming cell of SiO₂ having openings corresponding to light emitting regions of 2 mm by 2 mm were formed on the anode 5 by evaporation.

A 300 nm thick hole injection layer 7 of m-MTDATA (4,4',4"-tris (3-methylphenylamino) triphenylamine having a structural formula shown in FIG. 16) was formed on the anode 5 by vacuum evaporation at a deposition rate in the range of 0.2 to 0.4 nm/sec.

A 50 nm thick hole transport light emitting layer 4b of α-NPD (α-naphthylphenyldiamine) having a structural formula shown in FIG. 17 was formed on the hole injection layer 7 by vacuum evaporation at a deposition rate in the range of 0.2 to 0.4 nm/sec to construct a hole transport layer 4.

A 20 nm thick exciton generation promoting layer 33 of bathocuphenanthroline (4,7-biphenyl-1,10-phenanthroline) having a structural formula shown in FIG. 3 was formed on the hole transport light emitting layer 4b by evaporation at a deposition rate in the range of 0.2 to 0.4 nm/sec.

A 30 nm thick electron transport layer 2 was formed on the exciton generation promoting layer 33 by depositing $Alq_3$ (8-hydroxy quinoline aluminum) having a structural formula shown in FIG. 19 by evaporation, an about 10 nm thick cathode 1 was formed by depositing an aluminum-lithium alloy (about 1 mol % Li concentration) by evaporation. A two-layer sealing film consisting of a 200 nm Al film and a 200 nm thick Au film was formed by evaporation on the cathode 1 to complete the organic EL device 21J shown in FIG. 1.

The spectral characteristics of the organic EL device 21J were measured. Light emitted by the organic EL device 21J had a wide maximum emission wavelength range of 460 to 500 nm. It is obvious from the shape of the emission spectrum that the light is emitted by α-NPD and m-MTDATA, which signifies that an exciton generating region shifted from the α-NPD layer, i.e., the hole transport light emission layer 4b, near to the m-MTDATA layer, i.e., the hole injection layer 7. Although blue light could be emitted by forming the hole injection layer 7 in a thickness of 300 nm, the chromaticity of the light was not satisfactory, and light emitting efficiency tended to decrease. Therefore, it is preferable that the thickness of the hole injection layer 7 is 300 nm or below.

The exciton generation promoting layers 33 of the foregoing embodiments may be formed of any one of the phenanthroline derivatives respectively having structural formulas shown in FIGS. 5 to 10.

As is apparent from the foregoing description, according to the present invention, the exciton generation promoting layer for promoting the generation of excitons in light emitting regions by the recombination of electrons and holes is laminated to the light emitting regions. Accordingly, excitons can efficiently be generated in the light emitting regions by controlling the movement of holes, the organic EL device can be driven by power of a low voltage, is capable of emitting light of a stable specific wavelength (particularly, blue light) efficiently in a high luminance. Thus, a hole injection layer of a predetermined layer improves chromaticity, enhances the stability of the high-luminance, high-efficiency organic EL device and extends the life of such an organic EL device.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. An organic electro luminescent device comprising:
a transparent substrate having a surface;
a transparent electrode disposed an said surface;
an organic hole transport light emitting layer disposed on the transparent electrode, the organic hole transport light emitting layer having a highest occupied molecular orbital level (HOMO) and a lowest unoccupied molecular orbital level (LUMO);
an organic exciton generation promoting layer having a low fluorescence yield disposed on said organic hole transport light emitting layer, the organic exciton generation promoting layer having a HOMO and a LUMO;
organic electron transport layer disposed on the organic exciton generation promoting layer having a HOMO and a LUMO; and
a cathode disposed on the organic electron transport layer, wherein the HOMO of the organic exciton generation promoting layer is not energetically higher than the energetically lowest of:
the HOMO of the organic hole transport light emitting layer, or
the HOMO of the organic electron transport layer; the LUMO of the organic exciton generation promoting layer is not energetically lower than the energetically lowest of:
the LUMO of the organic hole transport light emitting layer, or
the LUMO of the organic electron transport layer; and wherein, the LUMO of the organic exciton generation promoting layer is not energetically higher than the energetically highest of:
the LUMO of the organic hole transport light emitting layer, or
the LUMO of the organic electron transport layer.

2. An organic electro luminescent device as defined in claim 1, further comprising an organic hole injection layer disposed between the transparent electrode and the organic hole transport light emitting layer having a thickness of about 250 nm or less, said organic hole injection layer having a HOMO energetically between a work function of the transparent electrode and the HOMO of the organic hole transport light emitting layer.

3. An organic electro luminescent device as defined in claim 1, wherein said organic hole transport light emitting layer comprises a plurality of organic hole transport light emitting layers.

4. An organic electro luminescent device as defined in claim 2, wherein said organic hole injection layer comprises 4,4',4"-tris-3-methylphenylamino-triphenylamine (m-MTDATA), said organic hole transport light emitting layer includes at least one layer comprising α-naphthylphenyldiamine (α-NPD), said organic exciton generation promoting layer comprises 2,9-dimethyl-4,7-diphenyl-1,10-phenanthroline (bathocuproin), and said organic electron transport layer comprises 8-hydroxyquinoline aluminum ($Alq_3$).

* * * * *